US010397445B2

(12) United States Patent
Ozaki et al.

(10) Patent No.: US 10,397,445 B2
(45) Date of Patent: Aug. 27, 2019

(54) SIGNAL PROCESSING DEVICE, PHOTOELECTRIC CONVERSION ELEMENT, IMAGE SCANNING DEVICE, IMAGE FORMING APPARATUS, AND METHOD OF PROCESSING SIGNAL

(71) Applicant: RICOH COMPANY, LTD., Tokyo (JP)

(72) Inventors: Tatsuya Ozaki, Kanagawa (JP); Masamoto Nakazawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/478,751

(22) Filed: Apr. 4, 2017

(65) Prior Publication Data
US 2017/0295298 A1  Oct. 12, 2017

(30) Foreign Application Priority Data

Apr. 7, 2016 (JP) ................. 2016-077243

(51) Int. Cl.
| | |
|---|---|
| *H04N 1/46* | (2006.01) |
| *H04N 1/60* | (2006.01) |
| *H04N 1/193* | (2006.01) |
| *H04N 5/378* | (2011.01) |
| *H04N 1/407* | (2006.01) |
| *H03M 1/12* | (2006.01) |

(52) U.S. Cl.
CPC ........... *H04N 1/6027* (2013.01); *H04N 1/193* (2013.01); *H04N 1/407* (2013.01); *H04N 5/378* (2013.01); *H03M 1/129* (2013.01); *H03M 1/1225* (2013.01); *H04N 2201/0094* (2013.01)

(58) Field of Classification Search
CPC ...... H04N 1/6027; H04N 1/193; H04N 5/378; H04N 2201/0094
USPC ....... 358/445, 446, 482, 483, 443, 512–514; 250/208.1; 375/233
See application file for complete search history.

(56) References Cited

U.S. PATENT DOCUMENTS

| | | | | |
|---|---|---|---|---|
| 5,276,685 A * | 1/1994 | Kepler | ................. | H03G 3/3078 370/332 |
| 5,453,744 A * | 9/1995 | VanDeusen | ........... | H03M 1/123 341/110 |
| 8,810,676 B2 * | 8/2014 | Lim | ..................... | H03M 1/144 341/156 |
| 9,325,340 B2 * | 4/2016 | Gonen | ................... | H03M 1/14 |

(Continued)

FOREIGN PATENT DOCUMENTS

| | | |
|---|---|---|
| JP | 2-288487 | 11/1990 |
| JP | 2001-309393 | 11/2001 |

(Continued)

*Primary Examiner* — Cheukfan Lee
(74) *Attorney, Agent, or Firm* — Oblon, McClelland, Maier & Neustadt, L.L.P.

(57) ABSTRACT

A signal processing device includes a first adjuster, a second adjuster, and a digitizer. The first adjuster coarsely adjusts an output range of a signal input to the first adjuster to output a first signal. The second adjuster adjusts an output range of a signal more finely than the first adjuster adjusts to output a second signal. The digitizer digitizes the first signal or the second signal to output a digital signal. The digital signal has an output range of a signal that is finely adjusted with the second adjuster after being coarsely adjusted with the first adjuster.

10 Claims, 22 Drawing Sheets

(56) References Cited

U.S. PATENT DOCUMENTS

| | | |
|---|---|---|
| 10,126,766 B2 * | 11/2018 | Cho .......................... G05F 1/56 |
| 2003/0215033 A1 * | 11/2003 | Drapkin ................. H03G 3/001 |
| | | 375/345 |
| 2008/0069199 A1 * | 3/2008 | Chen ................. H04L 25/03057 |
| | | 375/233 |
| 2009/0059324 A1 * | 3/2009 | Nagase .................. H03K 5/135 |
| | | 358/513 |
| 2014/0204427 A1 | 7/2014 | Nakazawa |
| 2014/0204432 A1 | 7/2014 | Hashimoto et al. |
| 2014/0211273 A1 | 7/2014 | Konno et al. |
| 2014/0368893 A1 | 12/2014 | Nakazawa et al. |
| 2015/0098117 A1 | 4/2015 | Marumoto et al. |
| 2015/0116794 A1 | 4/2015 | Nakazawa |
| 2015/0163378 A1 | 6/2015 | Konno et al. |
| 2015/0222790 A1 | 8/2015 | Asaba et al. |
| 2015/0304517 A1 | 10/2015 | Nakazawa et al. |
| 2016/0003673 A1 | 1/2016 | Hashimoto et al. |
| 2016/0006961 A1 * | 1/2016 | Asaba .................. H04N 5/3692 |
| | | 358/482 |
| 2016/0112660 A1 | 4/2016 | Nakazawa et al. |
| 2016/0119495 A1 | 4/2016 | Konno et al. |
| 2016/0173719 A1 | 6/2016 | Hashimoto et al. |
| 2016/0268330 A1 | 9/2016 | Nakazawa et al. |
| 2016/0295138 A1 | 10/2016 | Asaba et al. |
| 2016/0373604 A1 | 12/2016 | Hashimoto et al. |
| 2017/0019547 A1 | 1/2017 | Ozaki |
| 2017/0019567 A1 | 1/2017 | Konno et al. |

FOREIGN PATENT DOCUMENTS

| | | |
|---|---|---|
| JP | 2006-260526 | 9/2006 |
| JP | 2016-019056 | 2/2016 |

* cited by examiner

CONVERSION TABLE FOR HIGH SENSITIVITY

CONVERSION TABLE FOR LOW SENSITIVITY

Vtp: REFERENCE VOLTAGE OF UPPER SIDE OF ADC
Vbt: REFERENCE VOLTAGE OF LOWER SIDE OF ADC
REFERENCE VOLTAGE = Vtp − Vbt

Vtp: REFERENCE VOLTAGE OF UPPER SIDE OF ADC
Vbt: REFERENCE VOLTAGE OF LOWER SIDE OF ADC
REFERENCE VOLTAGE = Vtp − Vbt

Vtp: REFERENCE VOLTAGE OF UPPER SIDE OF ADC
Vbt: REFERENCE VOLTAGE OF LOWER SIDE OF ADC
REFERENCE VOLTAGE = Vtp − Vbt

Vtp: REFERENCE VOLTAGE OF UPPER SIDE OF ADC
Vbt: REFERENCE VOLTAGE OF LOWER SIDE OF ADC
REFERENCE VOLTAGE = Vtp − Vbt

Vtp: REFERENCE VOLTAGE OF UPPER SIDE OF ADC
Vbt: REFERENCE VOLTAGE OF LOWER SIDE OF ADC
REFERENCE VOLTAGE = Vtp − Vbt

US 10,397,445 B2

SIGNAL PROCESSING DEVICE, PHOTOELECTRIC CONVERSION ELEMENT, IMAGE SCANNING DEVICE, IMAGE FORMING APPARATUS, AND METHOD OF PROCESSING SIGNAL

CROSS-REFERENCE TO RELATED APPLICATION

This patent application is based on and claims priority pursuant to 35 U.S.C. § 119(a) to Japanese Patent Application No. 2016-077243, filed on Apr. 7, 2016, in the Japan Patent Office, the entire disclosure of which is hereby incorporated by reference herein.

BACKGROUND

Technical Field

Embodiments of the present disclosure relate to a signal processing device, a photoelectric conversion element, an image scanning device, an image forming apparatus, and a method of processing a signal.

Description of the Related Art

Image scanning devices use charge-coupled devices (CCD) and complementary metal oxide semiconductor (CMOS) sensors to convert reflected light (optical signals) from a scanned document into electrical signals, thereby scanning document information. In scanning the document information, prevention of saturation in a high density image and a low density image is preferable to suppress a gradation jump.

SUMMARY

An improved signal processing device includes a first adjuster, a second adjuster, and a digitizer. The first adjuster coarsely adjusts an output range of a signal input to the first adjuster to output a first signal. The second adjuster adjusts an output range of a signal more finely than the first adjuster adjusts to output a second signal. The digitizer digitizes the first signal or the second signal to output a digital signal. The digital signal has an output range of a signal that is finely adjusted with the second adjuster after being coarsely adjusted with the first adjuster.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings.

DETAILED DESCRIPTION

Figure 1A:
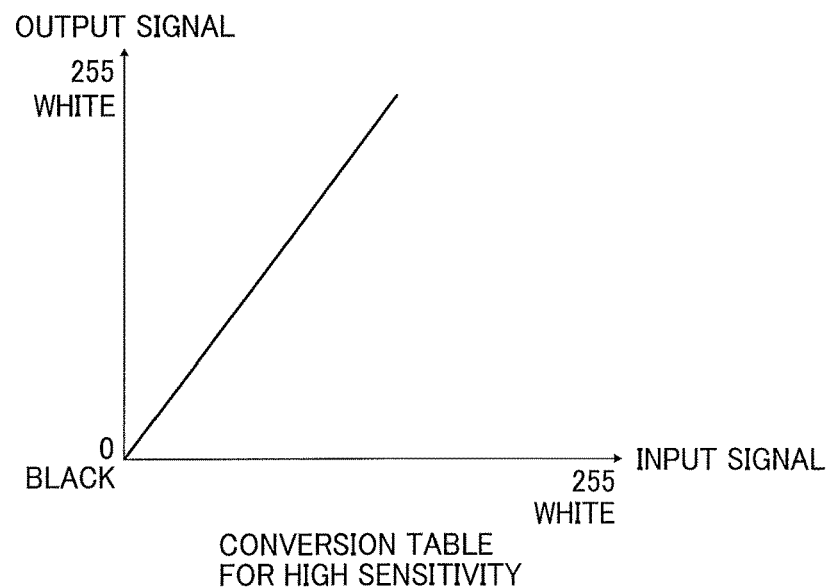
FIG. 1A and FIG. 1B are tables respectively illustrating high sensitivity conversion and low sensitivity conversion, according to related art.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operation in a similar manner, and achieve a similar result.

Figure 1B:
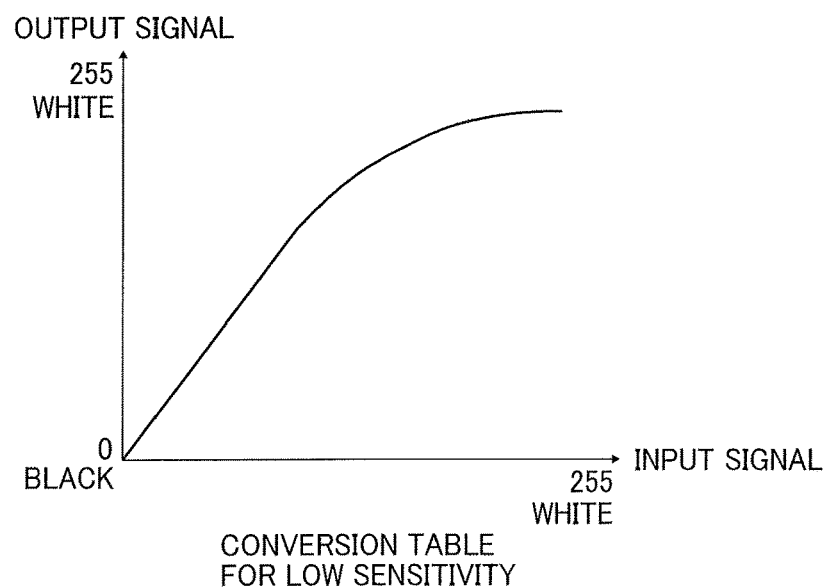

Conventionally, an image scanning device sometimes uses a conversion table for high sensitivity and a conversion table for low sensitivity to adjust sensitivity of scanning. For example, such an image scanning device detects the density of an image based on an image signal and switches sensitivity based on the detected density. To switch the sensitivity, the image scanning device switches the conversion table for high sensitivity, as illustrated in FIG. 1A, and the conversion table for low sensitivity, as illustrated in FIG. 1B.

Figure 2A:
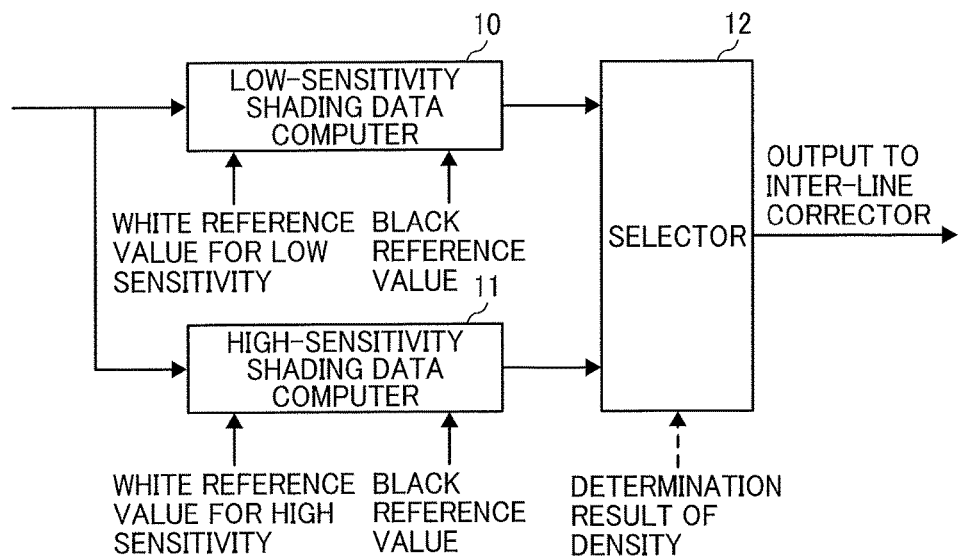
FIG. 2A and FIG. 2B are block diagrams each schematically illustrating an example configuration of an image scanning apparatus that switches a function for two types of sensitivity, according to related art.
Figure 2B:
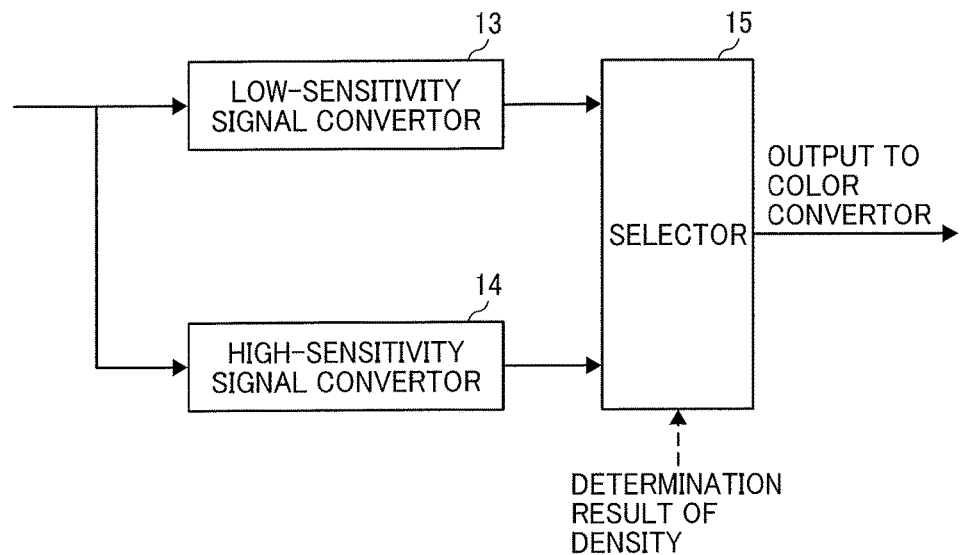

FIG. 2A and FIG. 2B are schematic block diagrams each illustrating such an image scanning device, which switches functions each for one of two types of sensitivity. Such an image scanning device may be configured as illustrated in FIG. 2A. In the image scanning device of FIG. 2A, a selector 12 switches between signals each output from a low-sensitivity shading data computer 10 and a high-sensitivity shading data computer 11. Such an image scanning device also may be configured as illustrated in FIG. 2B. In the image scanning device of FIG. 2B, a selector 15 switches between signals each output from a low-sensitivity signal convertor 13 and a high-sensitivity signal convertor 14.

A signal processing device according to embodiments is described below.

Figure 3A:
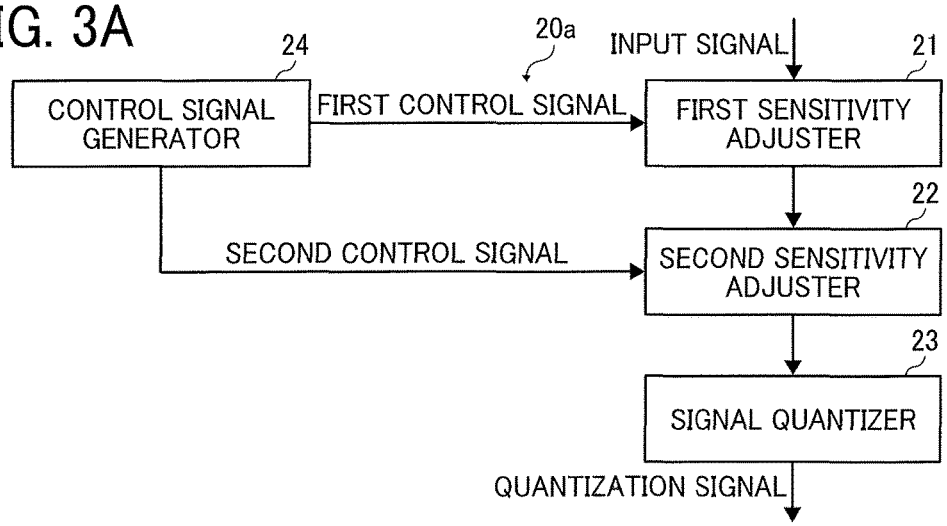
FIG. 3A, FIG. 3B, and FIG. 3C are block diagrams each schematically illustrating an example configuration of a signal processing device according to embodiments of the present disclosure.
Figure 3B:
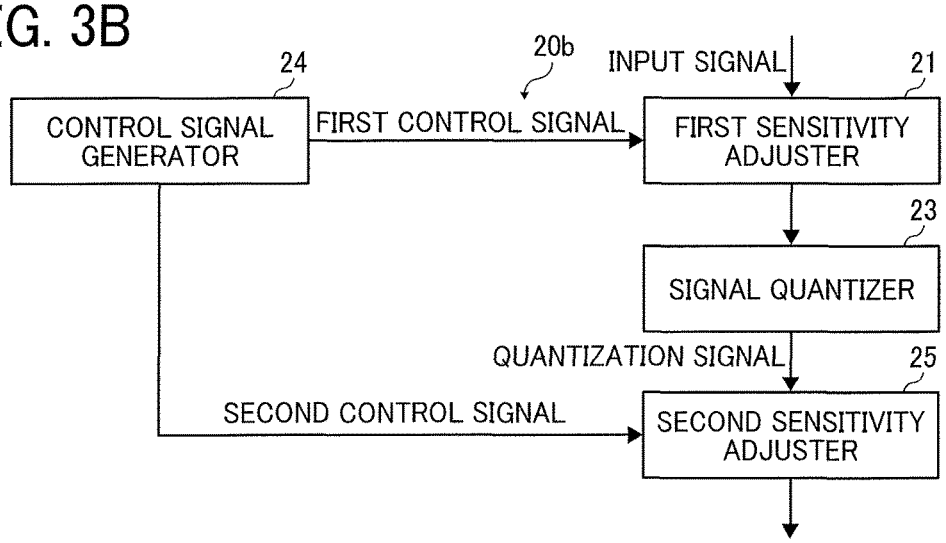
Figure 3C:
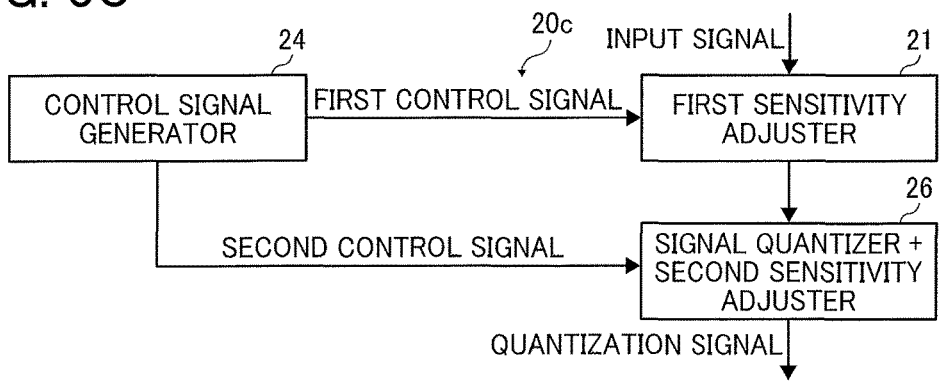

FIG. 3A, FIG. 3B, and FIG. 3C are schematic block diagrams each illustrating an example configuration of the signal processing device. Each of the signal processing devices 20a, 20b, and 20c is implemented in, for example, an image scanning device.

The signal processing device 20a includes a first sensitivity adjuster (first adjustment unit) 21, a second sensitivity adjuster (second adjustment unit) 22, a signal digitizer 23, and a control signal generator 24, as described in FIG. 3A. The first sensitivity adjuster 21 may be, for example, a programmable gain amplifier (PGA) that amplifies an input signal, which is photoelectrically converted from light into an electrical signal with a complementary metal oxide semiconductor (CMOS) sensor, by, for example, factors of 2, namely discrete factors such as 2 times, 4 times, 8 times, or the like.

The second sensitivity adjuster 22 is a PGA that adjusts an output range of a signal output from the first sensitivity adjuster 21 more finely than the first sensitivity adjuster 21 does. The second sensitivity adjuster 22 amplifies the output range of the signal, for example by 1.5 times. That is, the first sensitivity adjuster 21 coarsely adjusts the output range of the signal being input, and the second sensitivity adjuster 22 finely adjusts the output range of the signal.

The signal digitizer 23 digitizes the signal output from the second sensitivity adjuster 22 to generate a digital signal by performing analog-to-digital (A/D) conversion and outputs the digital signal. The control signal generator 24 controls a gain of the first sensitivity adjuster 21 and the second sensitivity adjuster 22. More specifically, the control signal generator 24 outputs a first control signal to the first sensitivity adjuster 21 to control a gain of the first sensitivity adjuster 21, and a second control signal to the second sensitivity adjuster 22 to control a gain of the second sensitivity adjuster 22.

Referring to FIG. 3B, the signal processing device 20b includes the first sensitivity adjuster 21, the signal digitizer 23, a second sensitivity adjuster (second adjustment unit) 25, and the control signal generator 24. The second sensitivity adjuster 25 is, for example, a digital gain adjuster that adjusts an output range of a signal output from the signal digitizer 23 more finely than the first sensitivity adjuster 21 does. The control signal generator 24 controls a gain of the first sensitivity adjuster 21 and the second sensitivity adjuster 25.

Referring to FIG. 3C, the signal processing device 20c includes the first sensitivity adjuster 21, a second adjustment unit (the signal digitizer plus the second sensitivity adjuster) 26, and the control signal generator 24. The second adjustment unit (the signal digitizer plus the second sensitivity adjuster) 26 digitizes a signal output from the first sensitivity adjuster 21 and adjusts an output range of the signal output from the first sensitivity adjuster 21 more finely than the first sensitivity adjuster 21 does. That is, the signal digitizer 23 and the second sensitivity adjuster 22 or 25 are integrated in the same circuit to process a signal as mentioned above. The second adjustment unit (the signal digitizer plus the second sensitivity adjuster) 26 is, for example, an A/D convertor, and adjusts the output range of the signal more finely than the first sensitivity adjuster 21 does, by adjusting a range of a reference voltage. The control signal generator 24 controls a gain of the first sensitivity adjuster 21 and the signal digitizer plus the second sensitivity adjuster 26.

Hereinafter, the first sensitivity adjuster 21 may be referred to as a PGA 21, and the second adjustment unit (the signal digitizer plus the second sensitivity adjuster) 26, with which a range of a reference voltage is adjusted (sensitivity is adjusted), may be referred to as an analog/digital (A/D) convertor 26.

Figure 4:
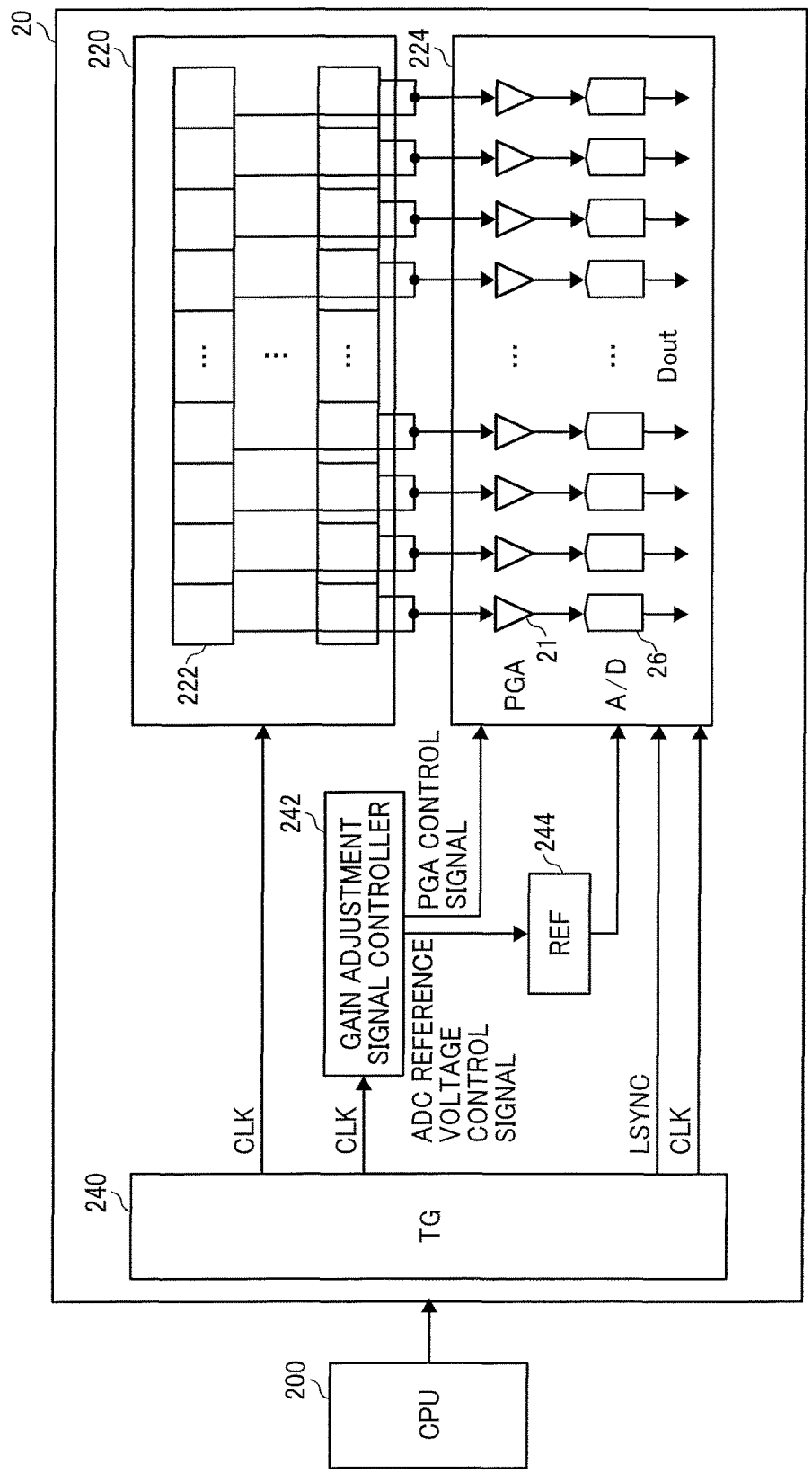
FIG. 4 is a block diagram illustrating a photoelectric conversion element according to a first embodiment and a peripheral component of the photoelectric conversion element.

FIG. 4 is a block diagram illustrating the signal processing device that is a photoelectric conversion element 20, according to a first embodiment, and a peripheral component of the photoelectric conversion element 20. The photoelectric conversion element 20 is, for example, a CMOS liner sensor that includes a photoelectric convertor 220, a signal processor 224, a timing controller (timing generator) (TG) 240, a gain adjustment signal controller 242, and a reference voltage generator (REF) that is a fine adjuster 244. The operation of the photoelectric conversion element 20, which is the CMOS liner sensor, is controlled by a central processing unit (CPU) 200.

The photoelectric convertor 220 includes a plurality of pixels (including a photo diode) 222. The plurality of pixels 222 are arranged in a plurality of columns and N of pixels are aligned in a row direction. Each of the plurality of columns includes the plurality of pixels 222 to be configured as a pixel group, and the photoelectric convertor 220 outputs signals that are photoelectrically converted from each column. Each of the plurality of pixels 222 photoelectronically converts on light reflected from a document and outputs an analog (image) signal.

The signal processor 224 includes N of PGAs 21 and N of A/D converters (A/Ds) 26. The signal processor 224 amplifies an analog signal, which is output from the photoelectric convertor 220 on a column basis, to convert the analog signal into a digital image signal to be output.

The gain adjustment signal controller 242 switches, or adjusts, a gain of each PGA 21. The gain adjustment signal controller 242 also adjusts a gain (output voltage range) of each A/D convertor 26 by controlling the operation of the fine adjuster 244. The fine adjuster 244 serves as a reference voltage generator and switches a reference voltage of each A/D convertor 26 in accordance with control of the gain adjustment signal controller 242. The timing controller 240 generates a signal to control each component included in the photoelectric conversion element 20. The timing controller 240 and the gain adjustment signal controller 242 may be, hereinafter, collectively referred to as a control signal generator (controller) 246.

Figure 5:
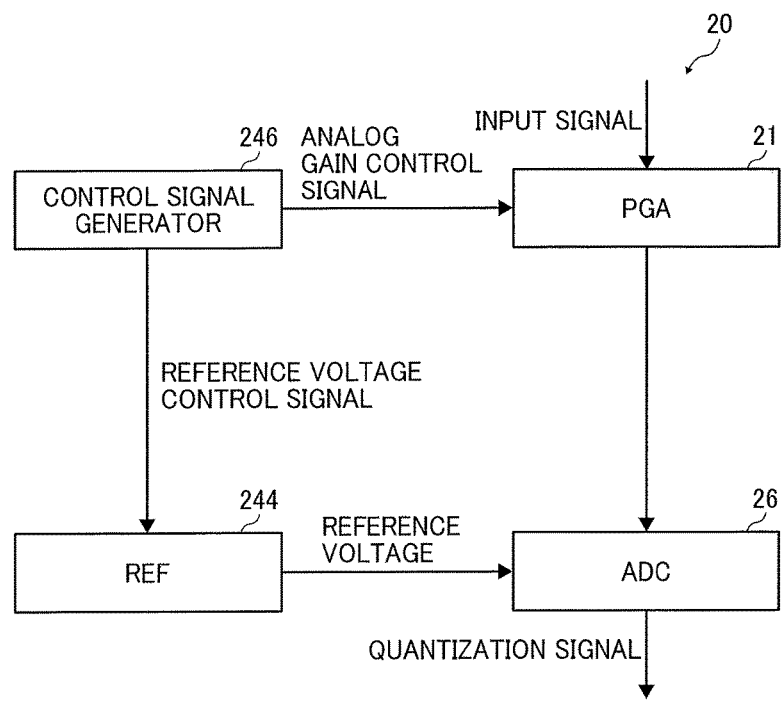
FIG. 5 is a block diagram schematically illustrating functions of the photoelectric conversion element of FIG. 4.

FIG. 5 is a block diagram schematically illustrating functions of the photoelectric conversion element 20 illustrated in FIG. 4. The control signal generator (controller) 246 causes the PGA 21 to adjust the input signal finely by outputting an analog gain control signal to the PGA 21. The control signal generator 246 causes the fine adjuster 244 to generate a predetermined reference voltage by outputting a reference voltage control signal to the fine adjuster 244. The fine adjuster 244 provides the generated reference voltage to the A/D convertor (ADC) 26. The A/D convertor 26 digitizes the signal, of which the gain is coarsely adjusted by the PGA 21, by A/D conversion, and finely adjusts the signal according to the reference voltage provided by fine adjuster 244.

Figure 6:
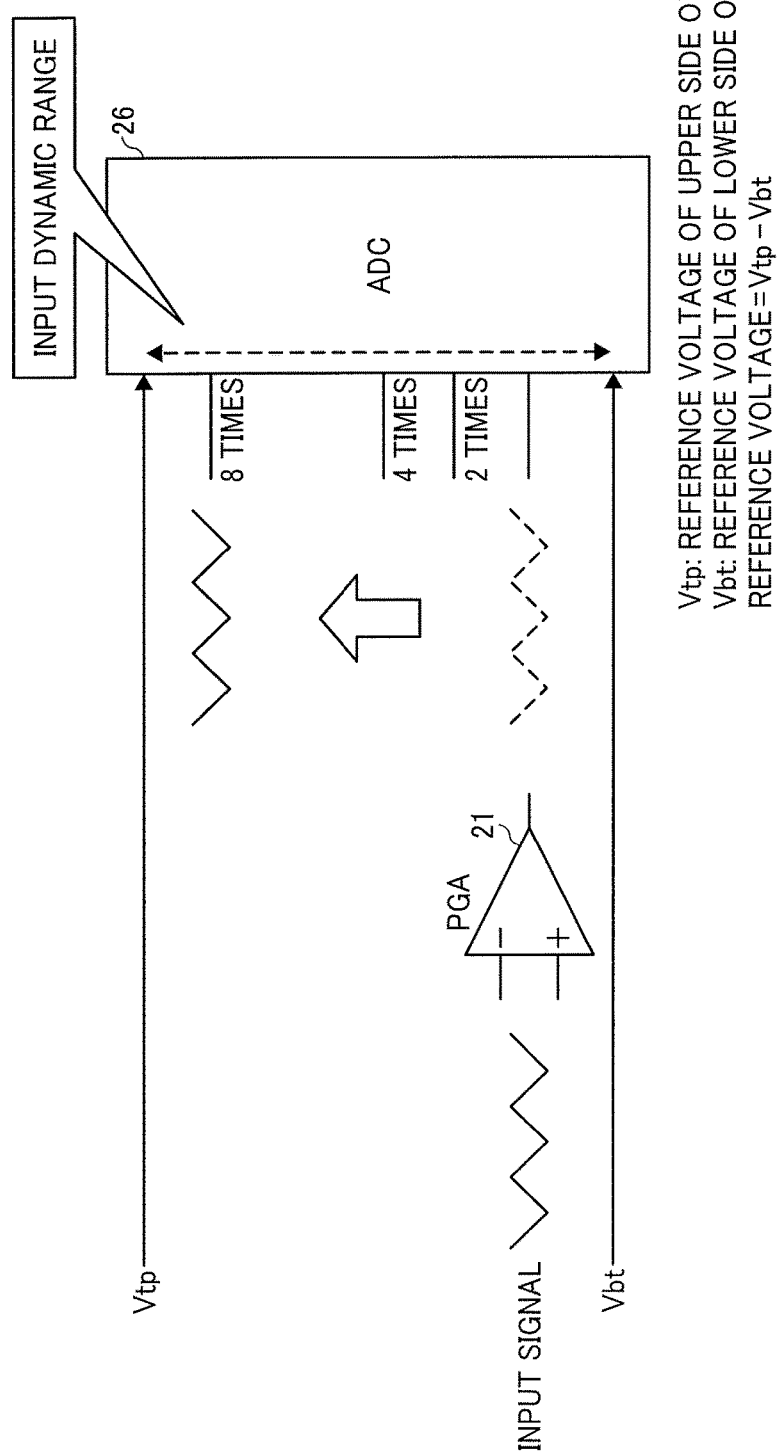
FIG. 6 is a diagram schematically illustrating coarse gain adjustment performed by a programmable gain amplifier (PGA) and fine gain adjustment performed by an analog-to-digital (A/D) convertor.

FIG. 6 is a schematic diagram illustrating coarse gain adjustment performed by the PGA 21, and fine gain adjustment (conversion gain) performed by the A/D convertor 26. In adjustment of sensitivity of the photoelectric conversion element 20 by changing a gain with the PGA 21, the gain has a discrete value such as a value of 2 times, 4 times, and 8 times.

The A/D convertor 26 compares the input signal to the reference voltage and converts the input signal into a digital signal. For example, when a reference voltage. (Vtp) of the A/D convertor 26, which is the 10-bit A/D convertor, corresponds to a digital signal of 1023, an input signal that is a half level of the reference voltage becomes a digital signal of 512 after the A/D conversion.

If the maximum value of the input signal is more or less half the reference voltage, a value of the digital signal may be in a range of 0 to 512, and a gradation of 10 bits cannot be acquired. The photoelectric conversion element 20, accordingly, amplifies the signal with the PGA 21 in such a manner that the dynamic range of the A/D convertor 26 can be used effectively, as illustrated in FIG. 6.

However, amplification factors of the PGA 21 are discrete, for example, 2 times, 4 times, and 8 times. Accordingly, for some input signals, the adjustment of the gain only by the PGA 21 may not be enough, if amplified without saturation, and the dynamic range of the A/D convertor 26 cannot be used effectively. The photoelectric conversion element 20, accordingly, finely adjusts the gain that cannot be completely adjusted with the PGA 21 by conversion gain adjustment, namely changing the reference voltage of the A/D convertor 26.

Figure 7A:
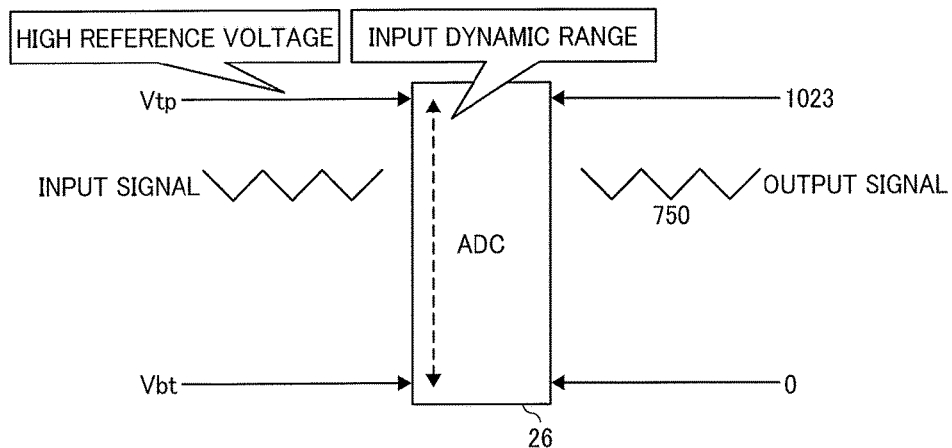
FIG. 7A is a diagram illustrating a signal state before changing a reference voltage of the A/D convertor.
Figure 7B:
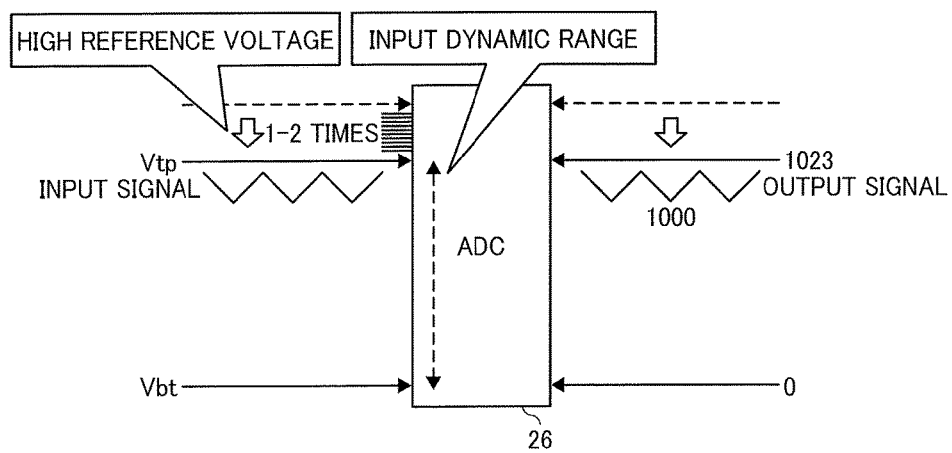
FIG. 7B is a diagram illustrating a signal state after changing the reference voltage of the A/D convertor.

FIG. 7A is a diagram illustrating input and output signals of the A/D convertor 26 when the reference voltage of the A/D converter 26 is not changed. FIG. 7B is a diagram illustrating input and output signals of the A/D convertor 26 when the reference voltage of the A/D converter 26 is changed. Referring to FIG. 7A and FIG. 7B, the photoelectric conversion element 20 can effectively use an input dynamic range of the A/D convertor 26 by changing the reference voltage based on the maximum value of the input signal. For example, the photoelectric conversion element 20 can amplify an input signal that is supposed to become a digital output of 750 as illustrated in FIG. 7A to a digital output of 1000 as illustrated in FIG. 7B.

The fine adjuster 244 can continuously change the reference voltage of the A/D convertor 26. This operation is more finely than the gain adjustment operation performed by the PGA 21. The photoelectric conversion element 20, accordingly, can finely adjust the gain in such a manner that gaps of gain adjustment widths due to the adjustment of the PGA 21 are filled by the operation of the fine adjuster 244.

Figure 8:
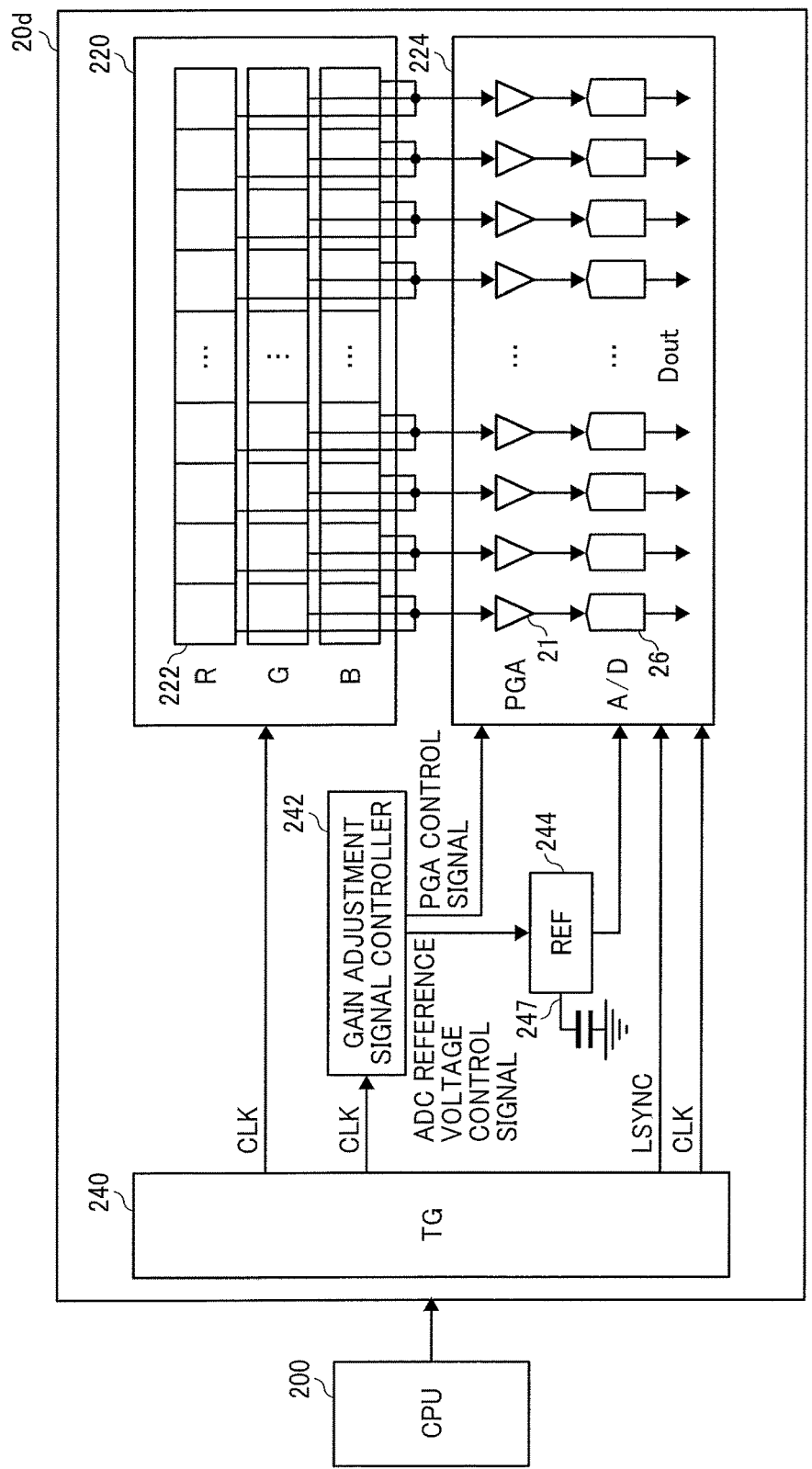
FIG. 8 is a block diagram illustrating a photoelectric conversion element according to a second embodiment and a peripheral component of the photoelectric conversion element.

FIG. 8 is a block diagram illustrating the signal processing device that is a photoelectric conversion element 20*d*, according to a second embodiment, and a peripheral component of the photoelectric conversion element 20*d*. The photoelectric conversion element 20*d* is, for example, a CMOS liner sensor that includes a photoelectric convertor 220, a signal processor 224, a timing controller (timing generator) (TG) 240, a gain adjustment signal controller 242, and a fine adjuster (REF) 244. The operation of the photoelectric conversion element 20*d*, which is the CMOS liner sensor, is controlled by a CPU 200.

The photoelectric convertor 220 includes a plurality of pixels 222 in which N of pixels (including photo diodes) are arranged in one direction for each of the colors red (R), green (G), and blue (B). Additionally, in the photoelectric convertor 220, the plurality of pixels 222 are arranged in a plurality of columns each of which includes the pixels (for example, each of pixels receives light of a corresponding color of R, G, B, etc.) to be configured as a pixel group, and the photoelectric convertor 220 outputs a signal that is photoelectrically converted in each column. The fine adjuster 244 is connected to a capacitor 247. The capacitor 247 is a large-capacity condenser provided to suppress noise for a reference voltage.

Figure 9:
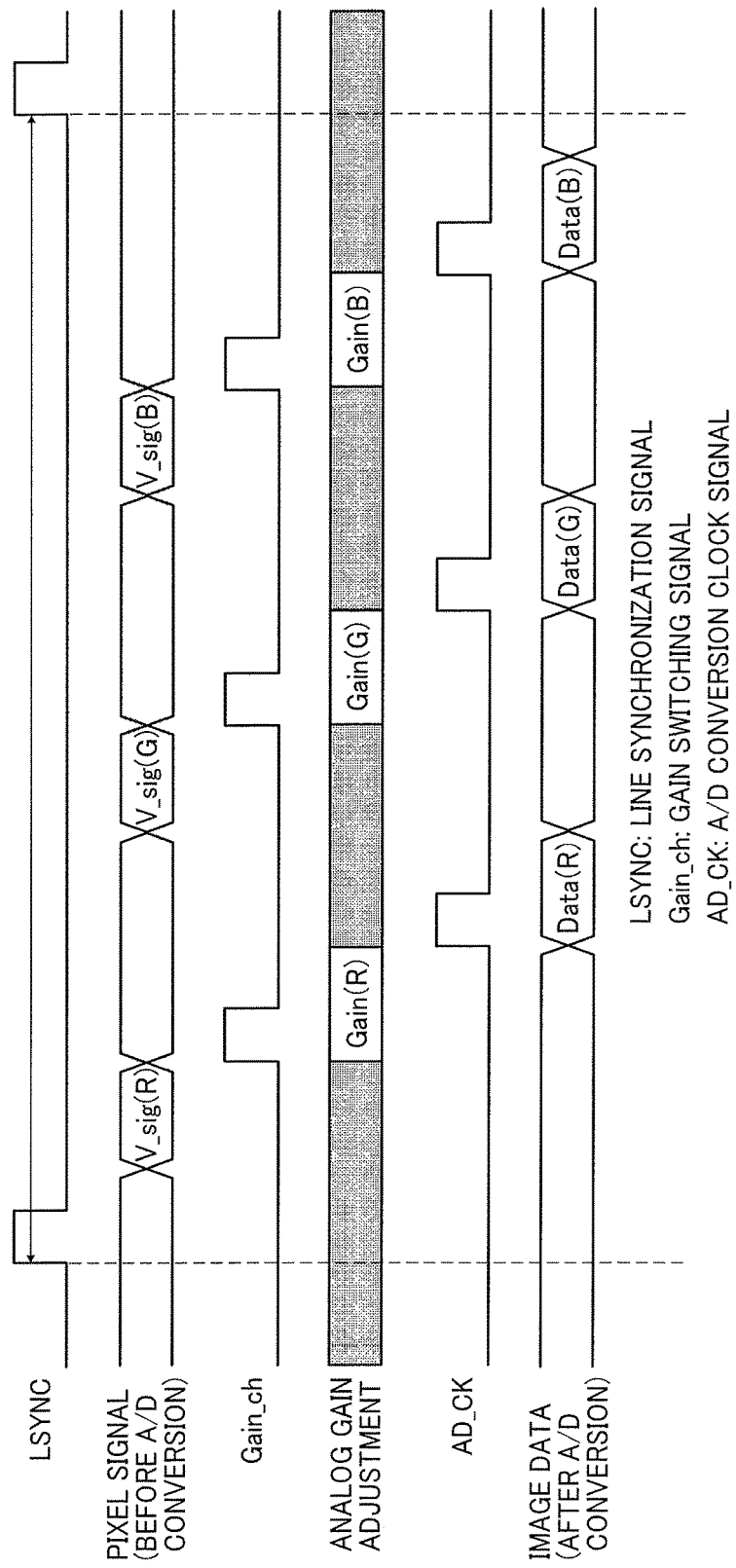
FIG. 9 is a timing chart illustrating an example of operation timing state in a first operation of the photoelectric conversion element of FIG. 8.

FIG. 9 is a timing chart illustrating an example of an operation timing state in a first operation of the photoelectric conversion element 20*d* illustrated in FIG. 8. If the photoelectric convertor 220 has a configuration in which three pixels of R/G/B are included in a column as a set, the photoelectric convertor 220 sequentially outputs pixel signals (voltage image signals) for each color from each of a plurality of columns after each pixel 222 performs charge-voltage conversion. The image signal of each color thus generated may be written in an analog memory. The memory may be any desired memory that is internal or external to the photoelectric conversion element 20*d*.

The photoelectric conversion element 20*d* sequentially amplifies the image signals each output from a corresponding one of the plurality of pixels 222 in one of the plurality of columns with the PGA 21, and then performs the A/D conversion on the signals with the A/D convertor 26. The photoelectric conversion element 20*d* is provided with the PGA 21 and the A/D convertor 26 for each of the plurality of columns, and thus scans, amplifies, and A/D converts the image signals in order of, for example, R, G, and B, as described in FIG. 9.

Each pixel of R, G, and B has a sensitivity that differs depending on color. The photoelectric conversion element 20*d*, accordingly, adjusts the gain of PGA 21 and the reference voltage of the A/D convertor 26 for each color to effectively use the dynamic range of the A/D convertor 26 for each pixel 222 of R, G, and B.

Figure 10:
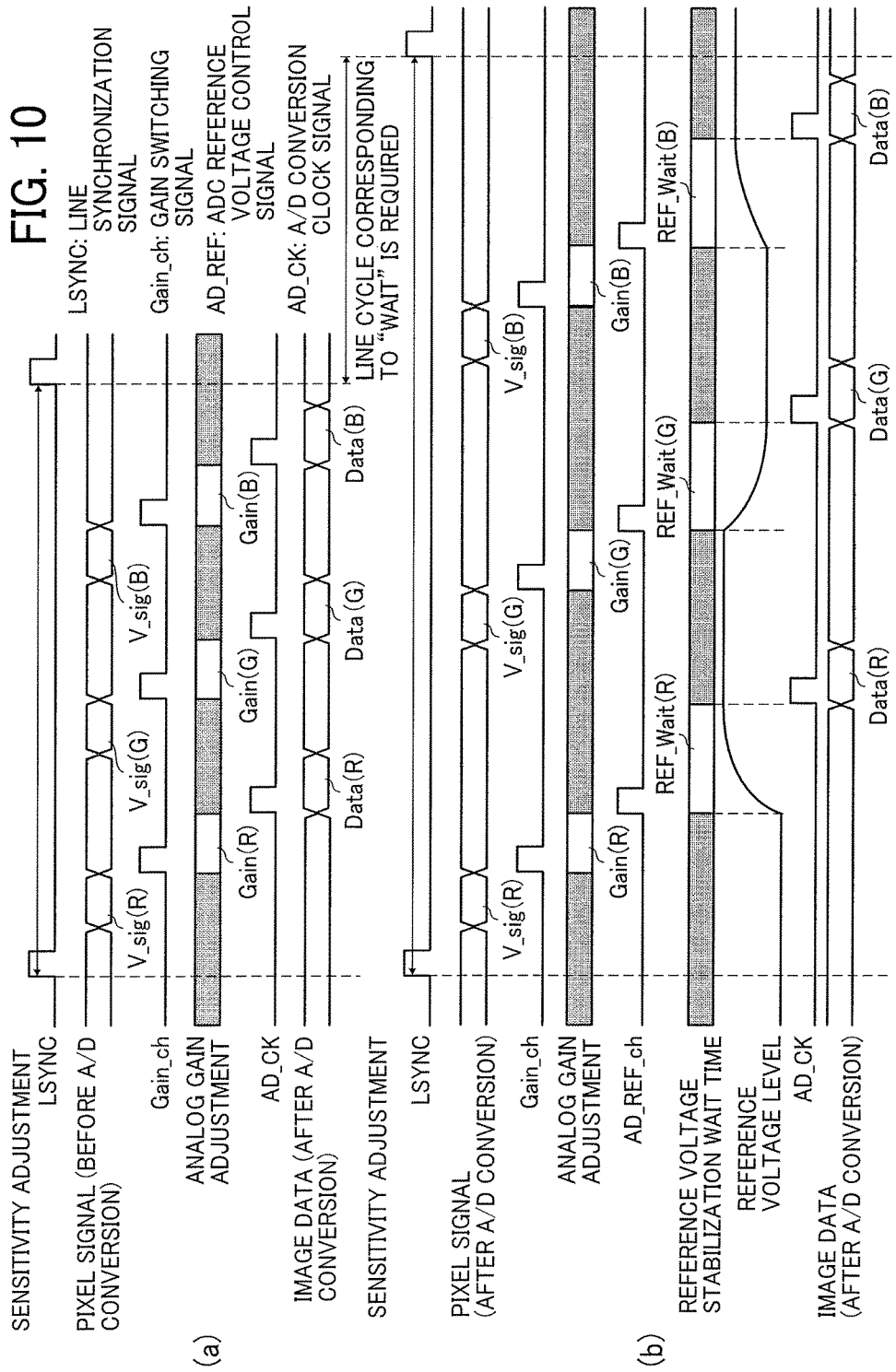
FIG. 10 is a timing chart illustrating an example of operation timing state in a second operation of the photoelectric conversion element.

FIG. 10 is a timing chart illustrating an example of an operation timing state in a second operation of the photoelectric conversion element 20*d*. In FIG. 10, the operation timing state in the second operation (See (b) of FIG. 10) is compared with an operation timing state of an operation without adjustment of the reference voltage (See (a) of FIG. 10). FIG. 10(*a*) illustrates an example of sensitivity adjustment with no reference voltage adjustment. FIG. 10(*b*) illustrates an example of sensitivity adjustment when the second operation of the photoelectric conversion element 20*d* is performed (with the reference voltage adjustment).

The photoelectric conversion element 20*d*, in which each pixel 222 of R, G, and B has different sensitivity, switches the gain for each color. In the example of FIG. 10, the fine adjuster 244 that is connected to the capacitor 247 requires a certain wait time until the reference voltage for each color is stabilized at a setting level, to finely adjust the sensitivity of the photoelectric conversion element 20d by changing the reference voltage of the A/D convertor 26.

Figure 11:
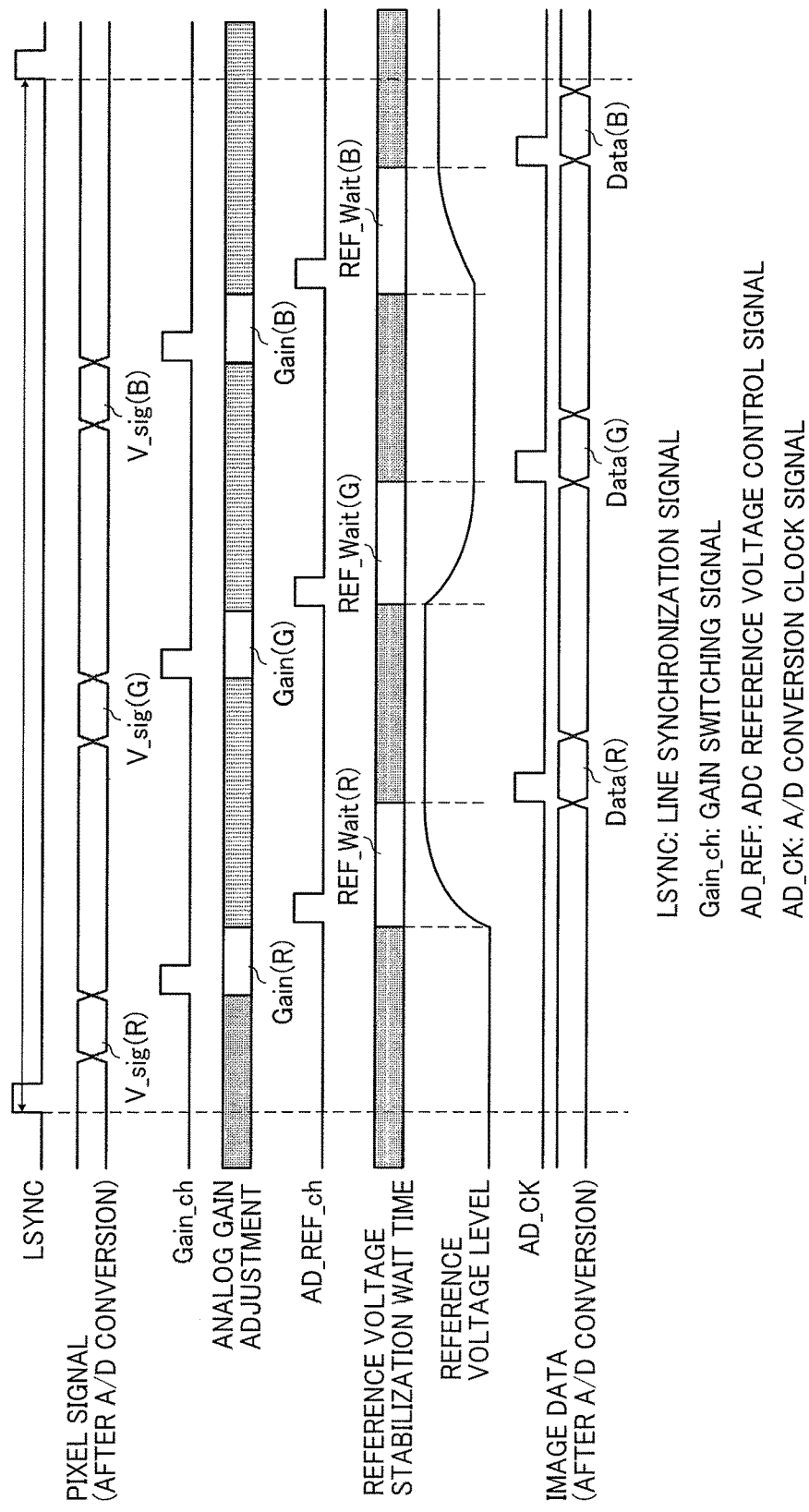
FIG. 11 is a timing chart illustrating the example of operation timing state in the second operation of the photoelectric conversion element.
Figure 12:
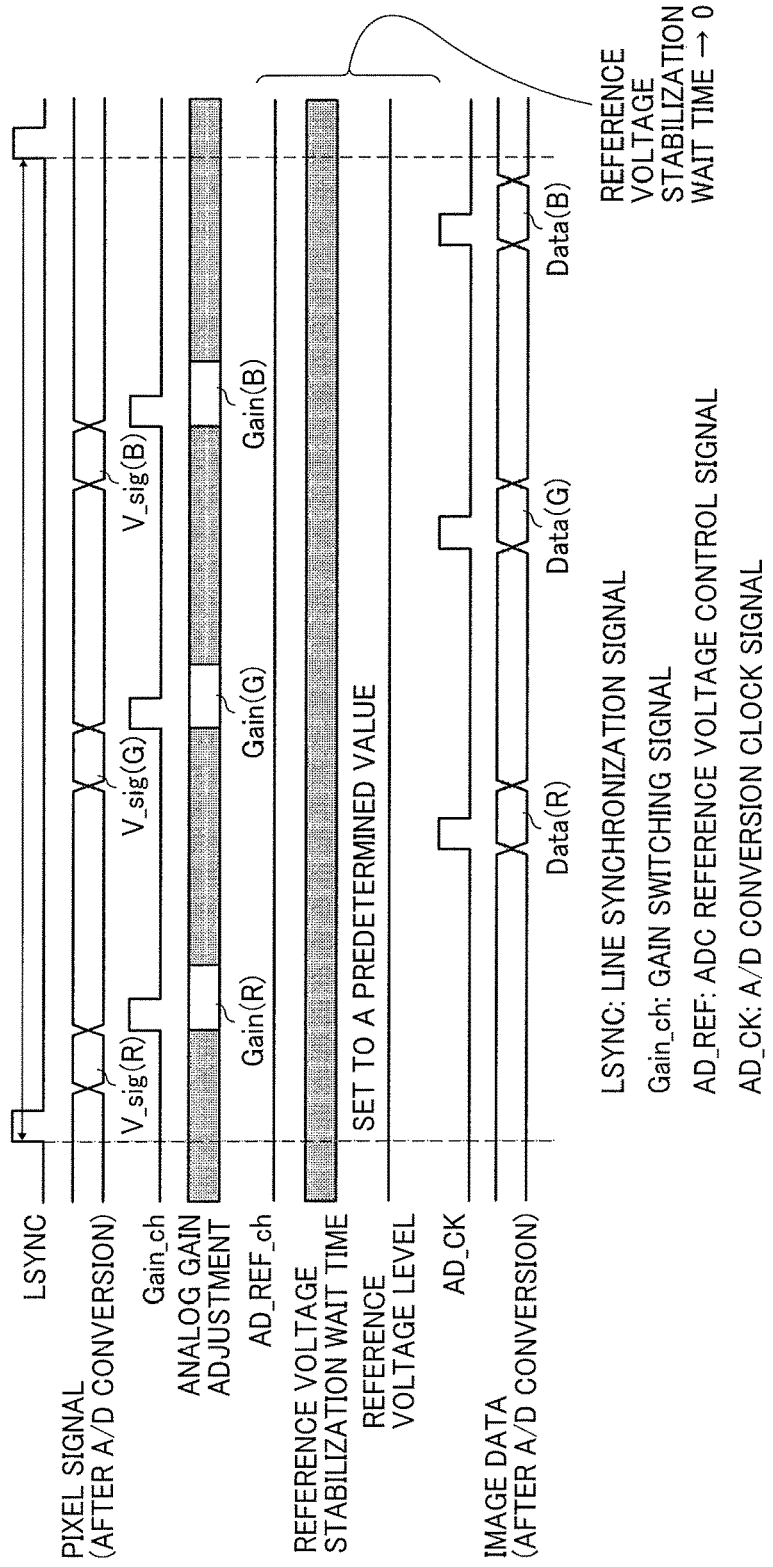
FIG. 12 is a timing chart illustrating an example of operation timing state in a third operation of the photoelectric conversion element.

Next, an example of a third operation of the photoelectric conversion element 20d is described, while comparing between the second operation of the photoelectric conversion element 20d illustrated in FIG. 11 and the third operation of the photoelectric conversion element 20d illustrated in FIG. 12.

In the example of the third operation illustrated in FIG. 12, the gain adjustment signal controller 242 causes the fine adjuster 244 to adjust the reference voltage for each color to be the same value among the colors. This prevents occurrence of the wait time until the reference voltage is stabilized, which is observed in the second operation illustrated in FIG. 11. The photoelectric conversion element 20d changes only an analog gain of the PGA 21 for each color in scanning an image. This eliminates the wait time for stabilizing the reference voltage as illustrated in FIG. 12, and thus the photoelectric conversion element 20d can maintain high speed operation of scanning.

Figure 13:
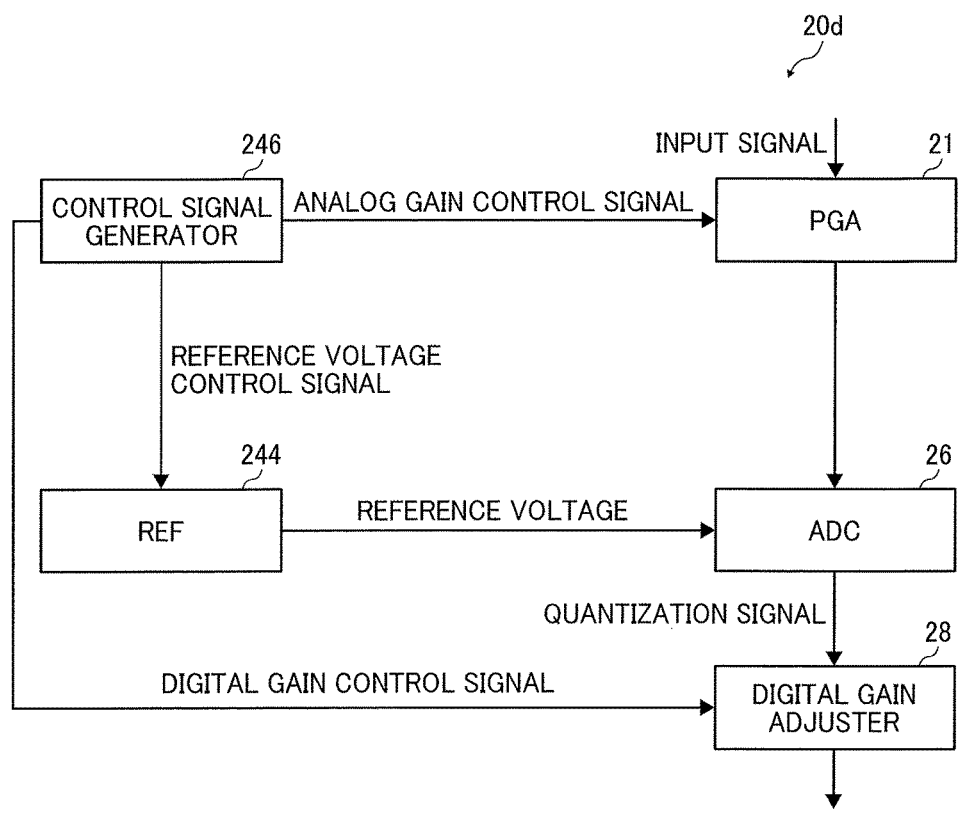
FIG. 13 is a block diagram schematically illustrating functions of a photoelectric conversion element according to a modification.

FIG. 13 is a block diagram schematically illustrating functions of a photoelectric conversion element according to a modification of the photoelectric conversion element 20d. As illustrated in FIG. 13, the modification of the photoelectric conversion element 20d includes a PGA 21, an A/D convertor 26, a digital gain adjuster 28, a control signal generator 246, and fine adjuster (REF) 244.

The digital gain adjuster 28 calculates in relation to a digital signal output from the A/D convertor 26 according to control of the control signal generator 246 to adjust a gain for at least one of the pixels 222 in each column. The number of bits of the A/D convertor 26 is set to be larger than the number of bits of a signal output, for example, from the digital gain adjuster 28.

Figure 14:
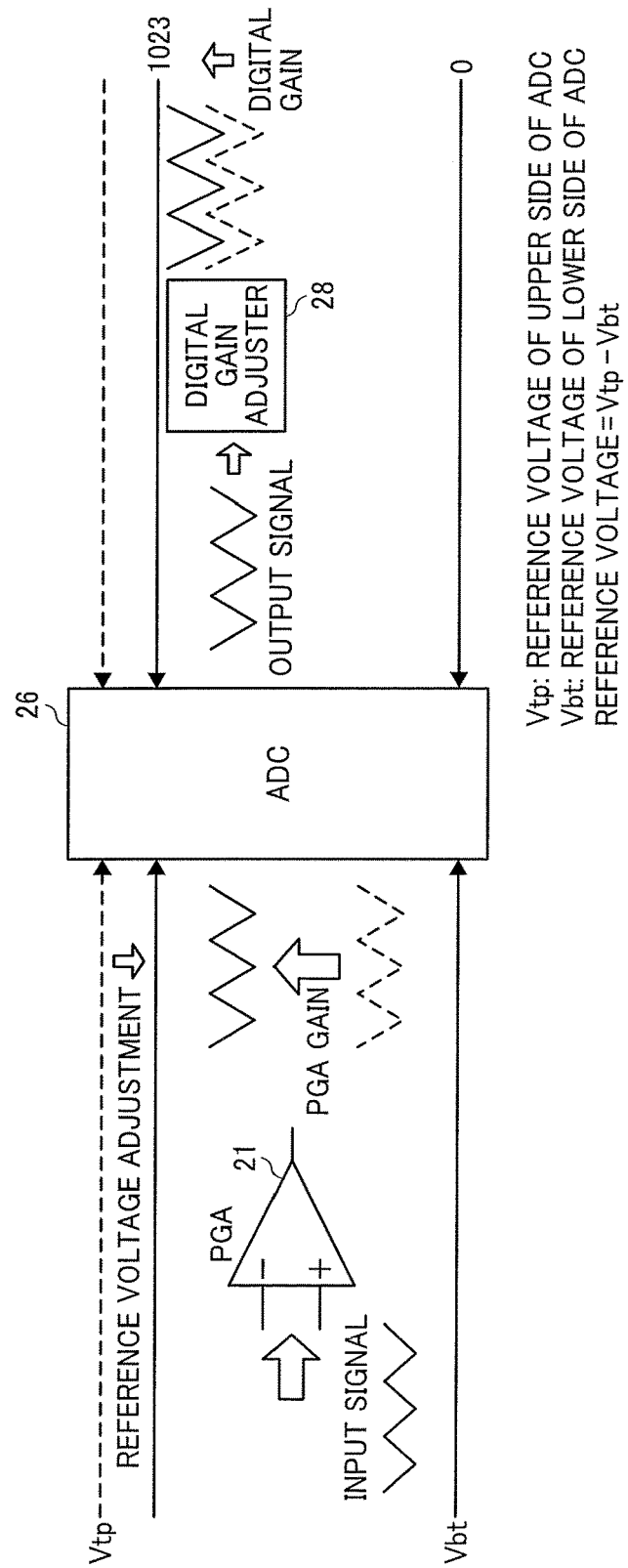
FIG. 14 is a diagram schematically illustrating operation of the photoelectric conversion element according to the modification of FIG. 13.

FIG. 14 is a diagram schematically illustrating operation of the modification of the photoelectric conversion element 20d illustrated in FIG. 13. The digital gain adjuster 28 can compensate when the gain of the PGA 21 is not enough. Setting the number of bits of the A/D convertor 26 larger than the number of bits of signal output from the digital gain adjuster 28 allows the digital gain adjuster 28 to maintain proper gradation of the output.

Additionally, the larger the number of the bits of the A/D convertor 26 is, the larger a circuit size and current consumption of the A/D convertor 26 becomes. Considering this, the modification of the photoelectric conversion element 20d has a limited range for the sensitivity adjustment of the digital gain by combining the fine adjustment of the sensitivity using the reference voltage adjustment performed by the A/D convertor 26 and the fine adjustment of the sensitivity due to the digital gain.

Figure 15A:
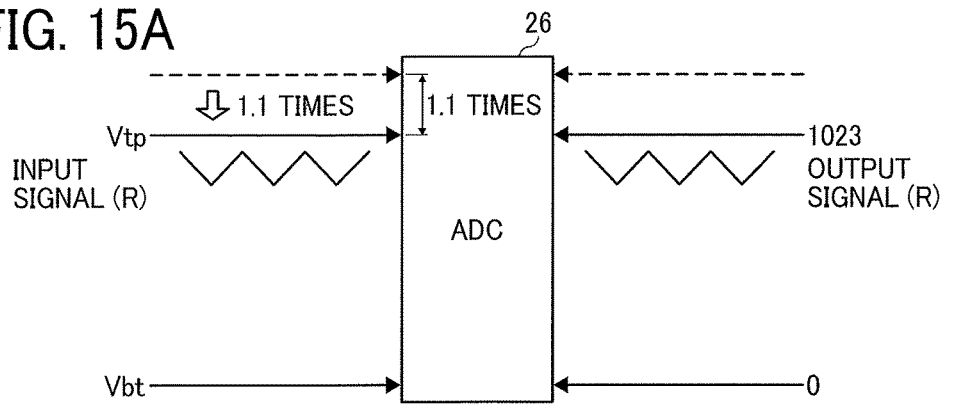
FIG. 15A, FIG. 15B, and FIG. 15C are diagrams each schematically illustrating an example of adjustment of a reference voltage performed by a fine adjustment unit.
Figure 15B:
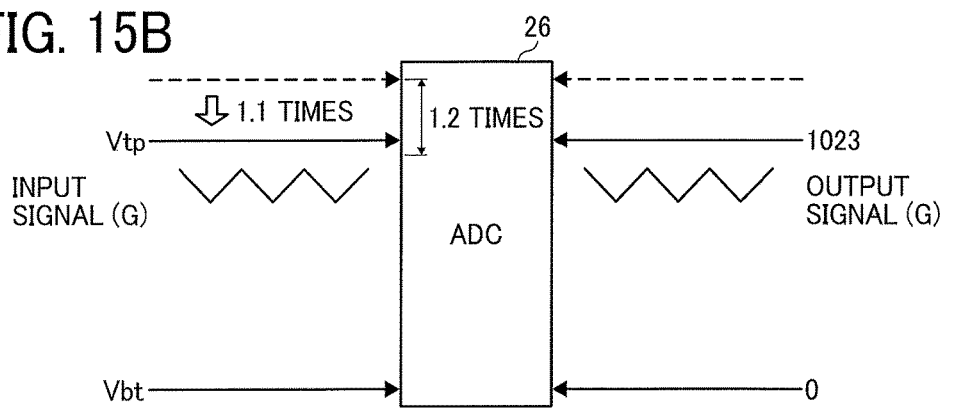
Figure 15C:
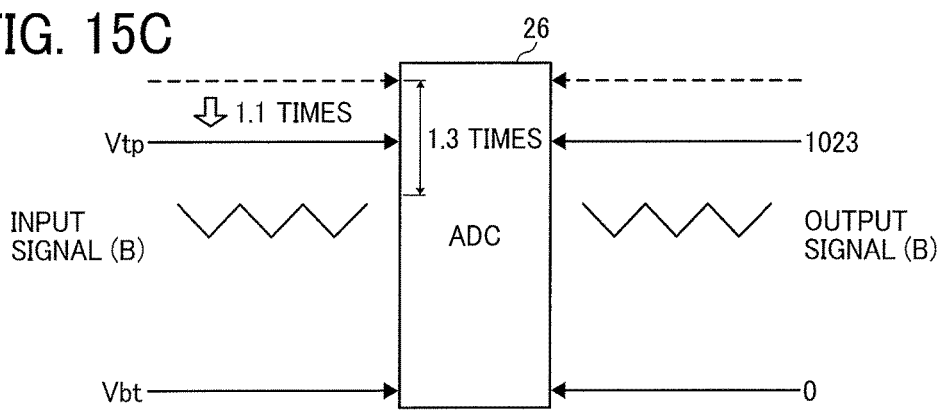

FIG. 15A, FIG. 15B, and FIG. 15C are schematic diagrams each illustrating an example of the reference voltage adjustment performed by the fine adjuster 244. When adjusting the reference voltage in association with the A/D convertor 26, which performs A/D conversion on the image signal for each color, in common to all colors, the fine adjuster 244 sets a value of the reference voltage to the minimum value of the gain of the A/D convertor 26 so that the image signal for any of the colors is not saturated. In other words, the fine adjuster 244 finely adjusts each output voltage range of signal output from each A/D convertor 26 to be set to the same range that is based on the maximum value of the signal level output from each of the plurality of pixels 222 included in the plurality of pixel groups.

For example, if a gain for optimal sensitivity is individually R: 1.1 time, G: 1.2 times, B: 1.3 times, the fine adjuster 244 adjusts the reference voltage to 1.1 times that is the lowest multiplying factor, which is the optimal sensitivity of R, because if 1.3 times of B is set to the common reference voltage, the image signals of R and G may be saturated.

Figure 16A:
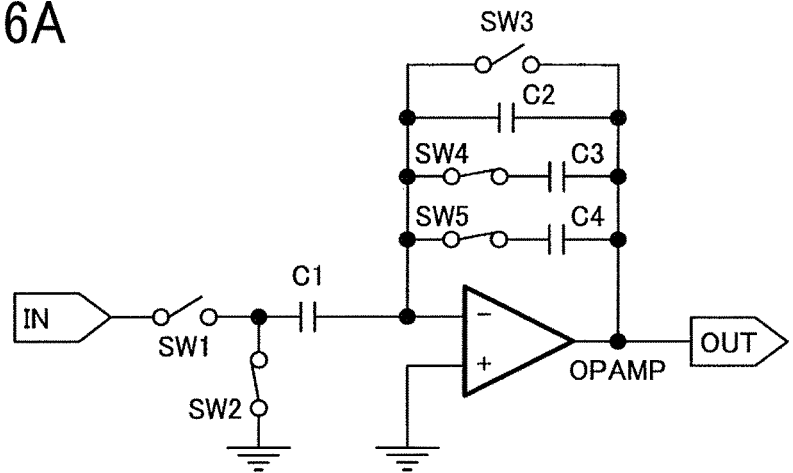
FIG. 16A, FIG. 16B, and FIG. 16C are illustrations of a first example of a circuit configuration of the PGA.
Figure 16B:
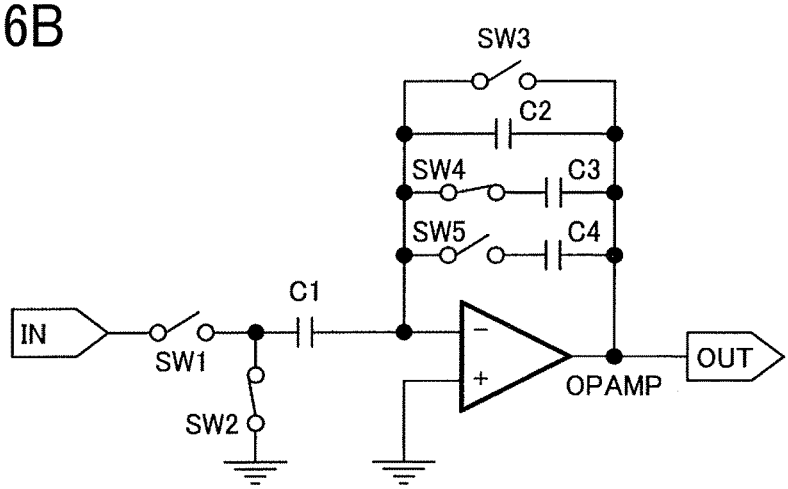
Figure 16C:
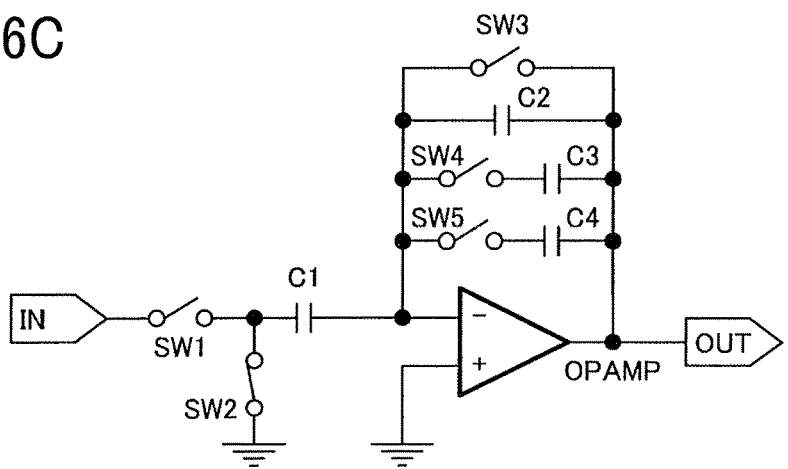

Next, an example configuration of the PGA 21 is described in detail. The PGA 21 is, for example, a switched capacitor PGA. FIG. 16A, FIG. 16B, and FIG. 16C are examples of first circuit configurations of the PGA 21. The PGA 21 adjusts the gain by switching feedback capacity using, for example, a plurality of capacitors and switches.

For example, when a switch SW4 is ON and a switch SW5 is ON, as illustrated in FIG. 16A, the feedback capacity is C20 C3+C4. Thus, the gain is C1/(C2+C3+C4).

Additionally, when the switch SW4 is ON and the switch SW5 is OFF, as illustrated in FIG. 16B, the feedback capacity is C2+C3. Thus, the gain is C1/(C2+C3).

Additionally, when the switch SW4 is OFF and the switch SW5 is OFF, as illustrated in FIG. 16C, the feedback capacity is C2. Thus, the gain is C1/C2.

Figure 17A:
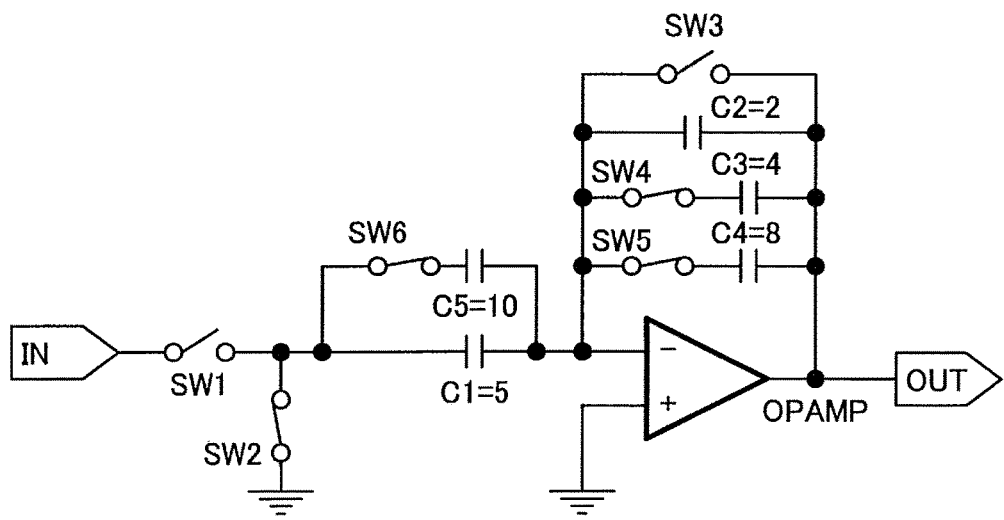
FIG. 17A and FIG. 17B are illustrations of a comparative example of a circuit configuration of the PGA.
Figure 17B:
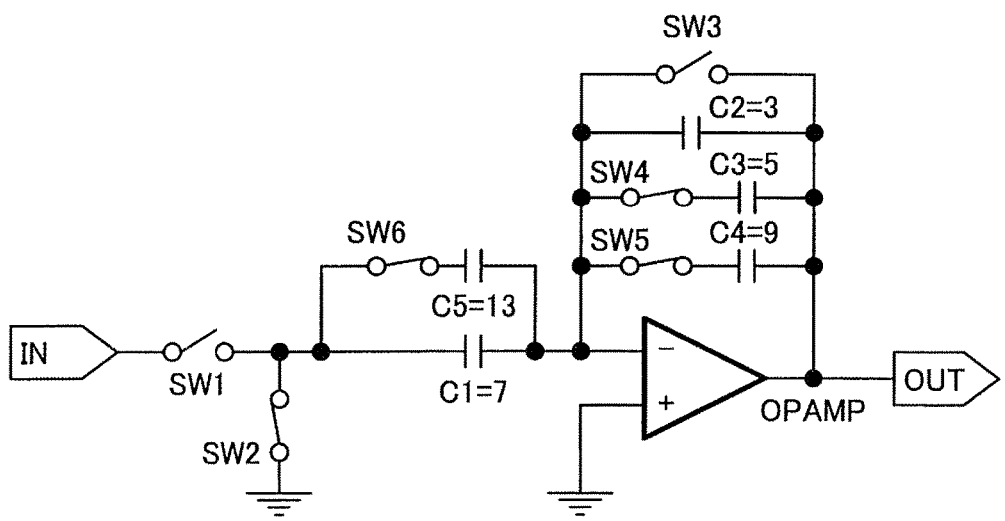

FIG. 17A and FIG. 17B are comparative examples of circuit configuration of the PGA. As illustrated in FIG. 17A and FIG. 17B, the gain of the PGA is adjusted by switching capacity values of input capacity and feedback capacity using switches. However, the capacitors have tolerances such that a plurality of types of capacitors (ratio including 2, 4, 8) may individually have different tolerances. This causes changes of ratio between the input capacity and the feedback capacity, resulting in improper gain setting.

Figure 18A:
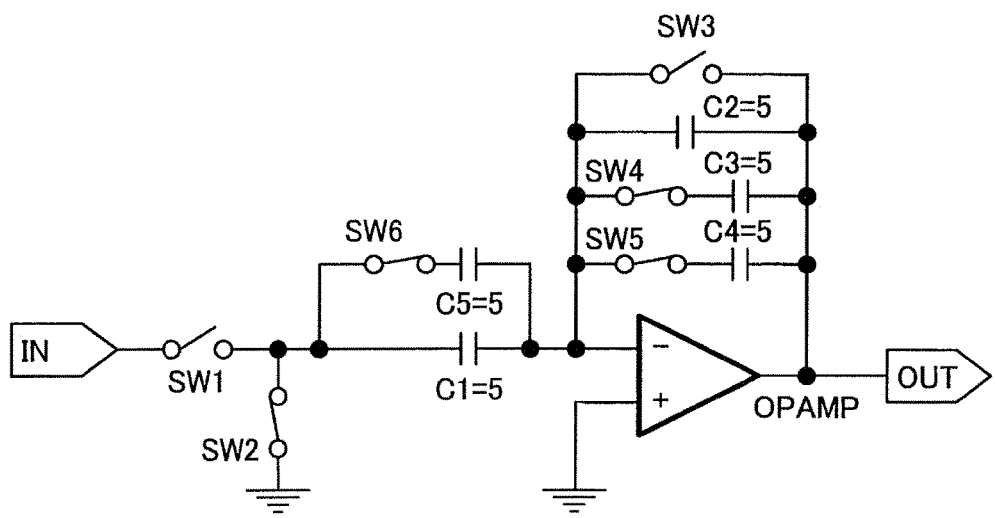
FIG. 18A and FIG. 18B are illustrations of a second example of a circuit configuration of the PGA.
Figure 18B:
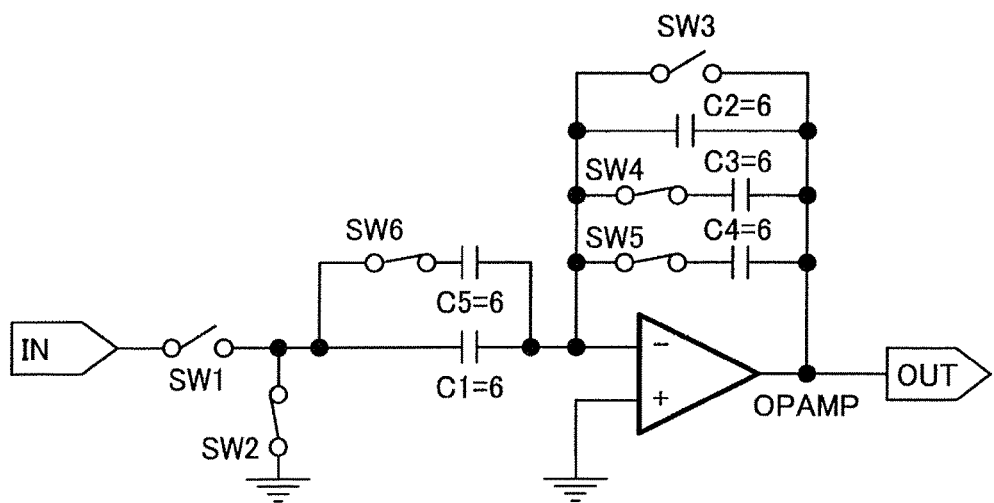

FIG. 18A and FIG. 18B are examples of second circuit configuration of the PGA 21. The examples of the second circuit configuration of the PGA 21 includes a plurality of unit capacitors and switches. In the example of the second configuration of the PGA 21, the plurality of specific unit capacitors are used to reduce the effect of capacity differences of the PGA occurring in the comparative example illustrated in FIG. 17. If the same capacitors are used in the PGA 21 and each capacity is generated on the same chip, the tolerance and temperature property hardly varies.

Figure 19A:
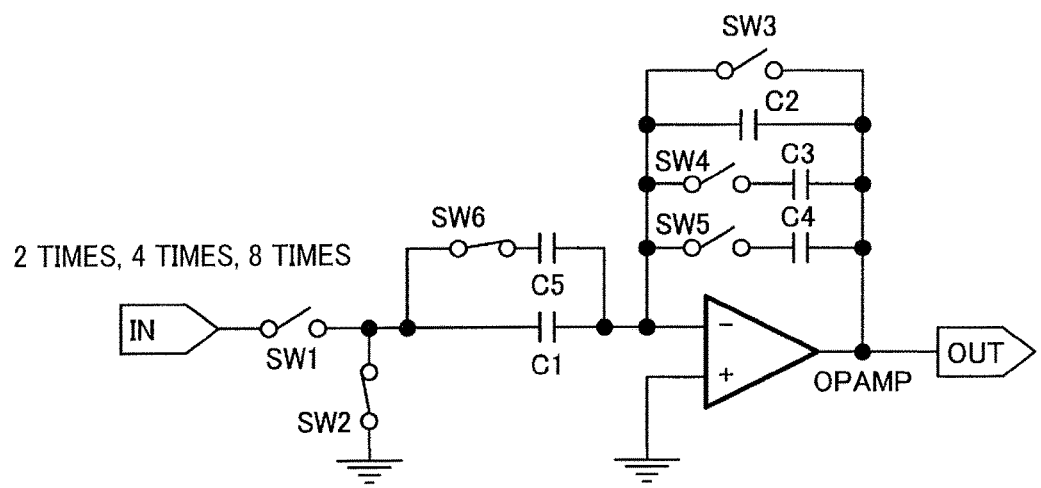
FIG. 19A and FIG. 19B are illustrations of a third example of a circuit configuration of the PGA.
Figure 19B:
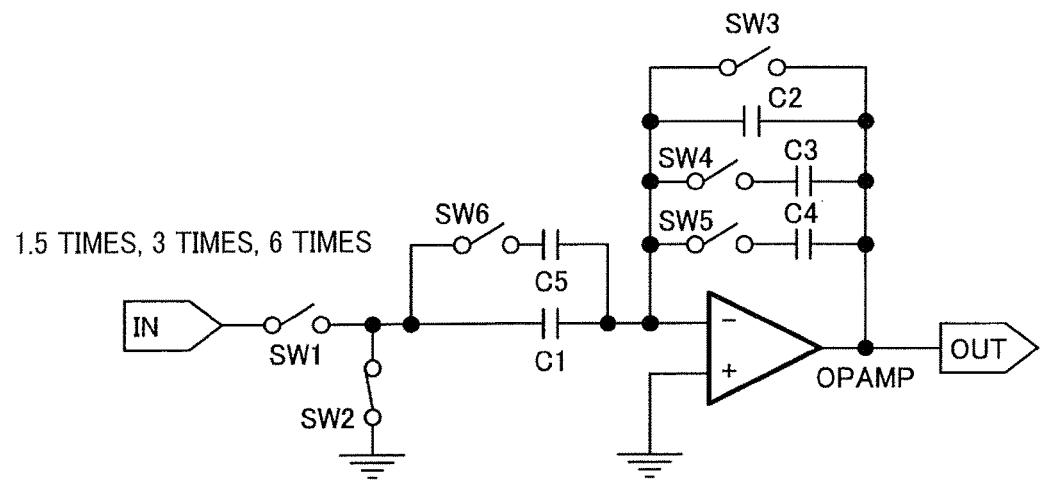

FIG. 19A and FIG. 19B are examples of a third configuration of the PGA 21. The PGA 21 determines a gain due to, for example, ratio of input capacity and feedback capacity. At this time, a plurality of unit capacitors for the input capacitor as well as the feedback capacitor are combined and used so that steps of the adjustment of the gain is variable.

For example, when a switch SW6 is ON, as illustrated in FIG. 19A, the input capacity is C2+C5. The gain is adjusted in a way of (C1+C5)/C2, (C1+C5)/(c2+C3), or (c1+C5)/(c2+C3+C4) with ON/OFF operation of the switch SW4 and the switch SW5.

When the switch 6 is OFF, as described in FIG. 19B, the input capacity is C1. The adjustment of the gain is as C1/C2+C3), and C1/(C2+C3+C4), according to the ON/OFF operation of the switches SW4 and SW5. As described above, the PGA 21, in which the input capacity is variable, can change the way the gain is adjusted by adjusting the feedback capacity.

Figure 20A:
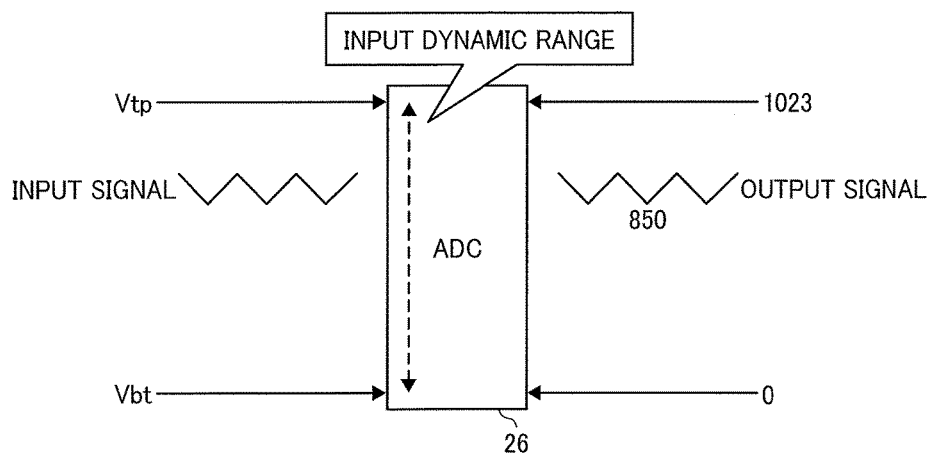
FIG. 20A and FIG. 20B are diagrams illustrating adjustment according to a first modification associated with the A/D convertor.
Figure 20B:
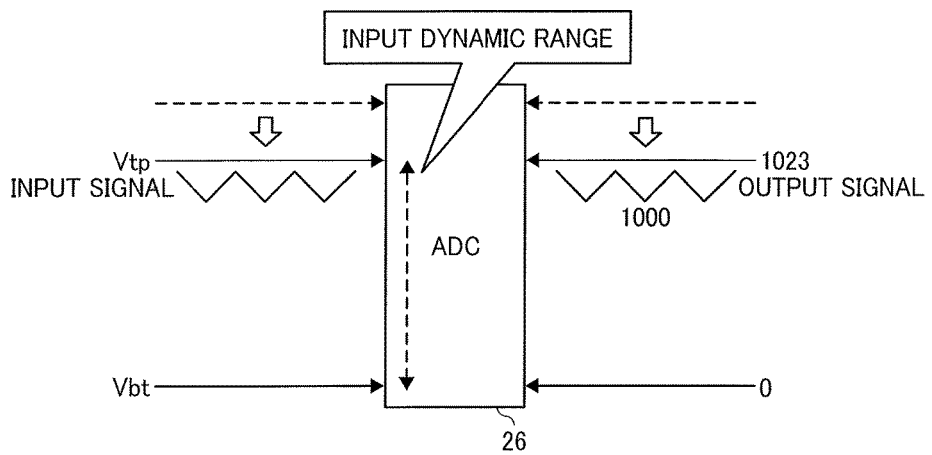

FIG. 20A and FIG. 20B are examples of a first modification of the adjustment in relation to the A/D converter 26. The fine adjuster 244 may not only increase the conversion gain in relation to the A/D convertor 26, but also attenuate. That is, the A/D convertor 26 can amplify a signal due to decreasing of the reference voltage according to an input signal.

Figure 21A:
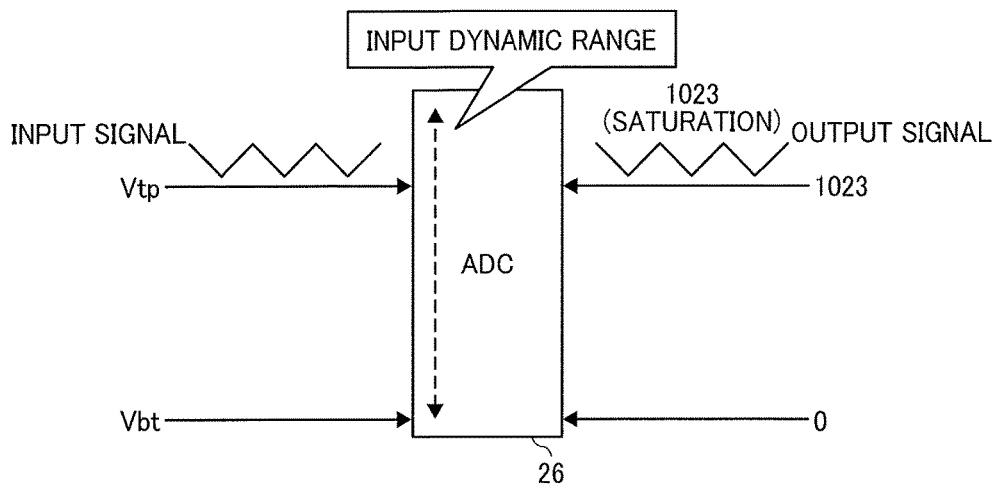
FIG. 21A and FIG. 21B are diagrams illustrating adjustment according to a second modification associated with the A/D convertor.
Figure 21B:
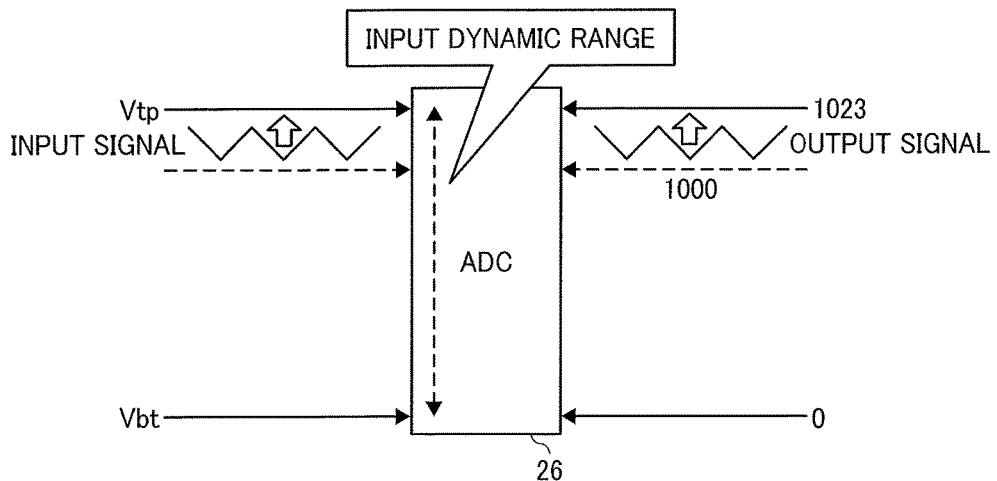

The fine adjuster 244 may amplify the conversion gain in relation to the A/D convertor 26 as described in FIG. 21A and FIG. 21B. That is, when the input signal is above the reference voltage in the A/D convertor 26, the input signal can be relatively attenuated by increasing the reference voltage using the fine adjuster 244.

An image scanning device and an image forming apparatus including the photoelectric conversion element 20 according to one of the embodiments are described.

Figure 22:
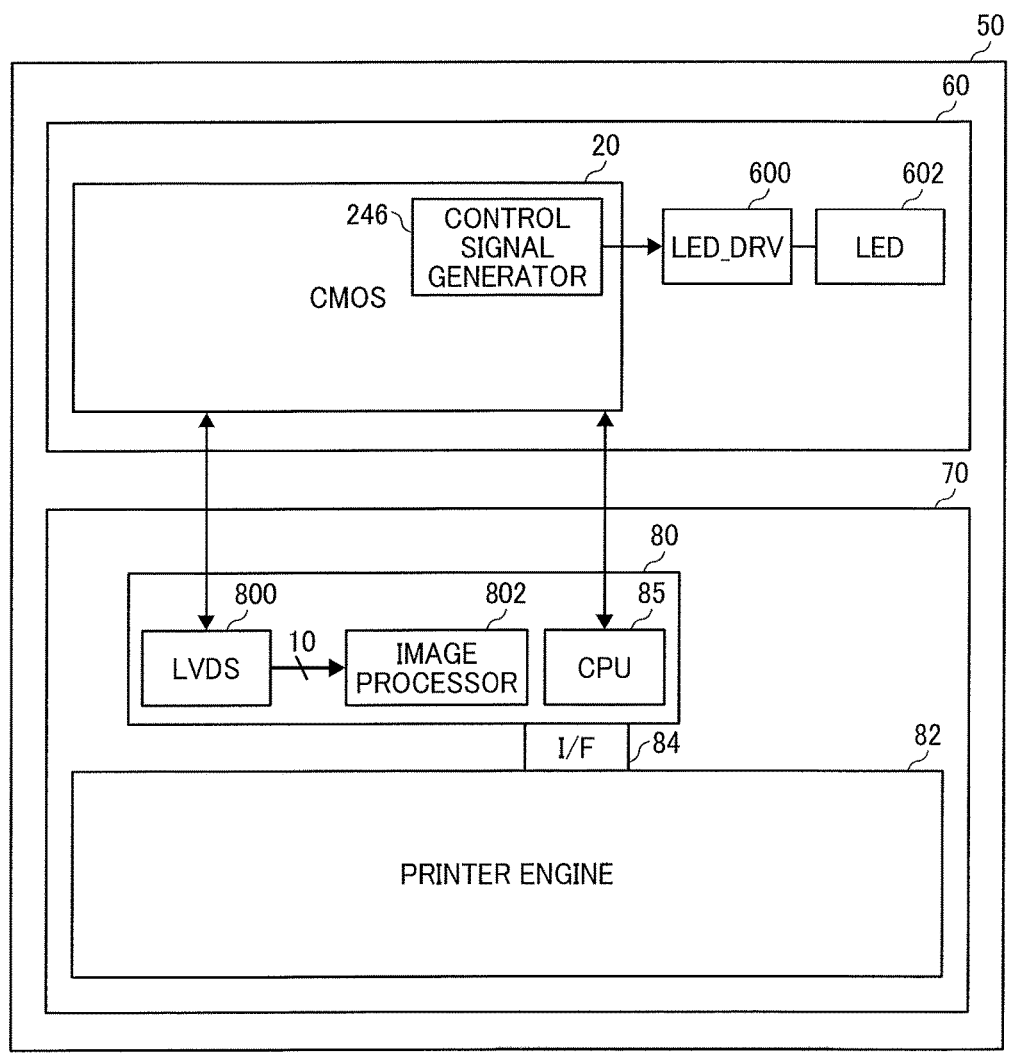
FIG. 22 is a schematic diagram illustrating an image forming apparatus including an image scanning device incorporating the photoelectric conversion element.

FIG. 22 is a schematic diagram illustrating an image forming apparatus 50 including the image scanning device 60 incorporating the photoelectric conversion element 20. The image forming apparatus 50 is, for example, a multi-function peripheral that includes the image scanning device 60 and an image forming device 70.

The image scanning device 60 includes, for example, the photoelectric conversion element 20, a light emitting diode driver (LED_DRV) 600, and an LED 602. The LED driver 600 drives the LED 602 synchronized with a line synchronization signal output from, for example, the control signal generator 246. The LED 602 emits light to a document. The photoelectric conversion element 20 receives reflected light from the document to start accumulating charges generated with a plurality of light receiving elements in synchronization with, for example, such a line synchronization signal. The photoelectric conversion element outputs image data to the image forming device 70 after performing, for example, a parallel-serial conversion.

The image forming device 70 includes a processor 80 and a printer engine 82. The processor 80 and the printer engine 82 are connected to each other via an interface (I/F) 84.

The processor 80 includes a low voltage differential signaling interface device (LVDS) 800, an image processor 802, and a central processing unit (CPU) 85. The CPU 85 performs operation according to a program stored in a memory, and controls elements, such as a photoelectric conversion element 20, included in the image forming apparatus 50.

The photoelectric conversion element 20 outputs image data, a line synchronization signal, a transfer clock, and the like, of an image scanned by the image scanning device 60 to the LVDS 800. The LVDS 800 receives and then converts the image data, the line synchronization signal, and the transfer clock, and the like into 10 bits of parallel data. The image processor 802 processes the image using the converted 10 bits of data and outputs the image data and the like to the printer engine 82. The printer engine 82 prints out the image using the received image data.

The signal processing device, according to the embodiment, includes a first adjuster to coarsely adjust an output range of a signal input to the first adjuster to output a first signal, a second adjuster to adjust an output range of a signal more finely than the first adjuster adjusts to output a second signal, and a digitizer to digitize the first signal or the second signal to output a digital signal, the digital signal having an output range of a signal that is finely adjusted with the second adjuster after being coarsely adjusted with the first adjuster. The signal processing device outputs the digital signal of which the output range is finely adjusted after being coarsely adjusted in a manner that the digitizer digitizes the signal output from the second adjuster, the second adjuster finely adjusts the output range of the digital output from the digitizer, or the digitizer and the second adjuster finely adjust the output range of the signal output from the first adjuster.

The method of processing a signal includes coarsely adjusting an output range of a signal to output a first signal, finely adjusting an output range of a signal more finely than the coarsely adjusting, and digitizing the first signal or the second signal to output a digital signal, the digital signal having an output range of a signal that is finely adjusted by the finely adjusting step after being coarsely adjusting by the coarsely adjusting step. The output range of the digital signal to be output is finely adjusted after coarsely adjusted by digitizing the signal that is finely adjusted, by finely adjusting the output range of the digital signal generated by digitizing, or by simultaneously finely adjusting the output range of the signal and digitizing the signal.

As described above, one or more embodiments provide a signal processing device, a photoelectric conversion element, an image scanning device, an image forming apparatus, and a method of processing a signal that adjust an output range with high accuracy and output a digital signal.

Additionally, each of the functions of the described embodiments may be implemented by one or more processing circuits or circuitry. Processing circuitry includes a programmed processor, as a processor includes circuitry. A processing circuit also includes devices such as an application specific integrated circuit (ASIC), DSP (digital signal processor), FPGA (field programmable gate array) and conventional circuit components arranged to perform the recited functions.

Although the exemplary embodiments of the disclosure have been described and illustrated above, such description is not intended that the disclosure be limited to the illustrated embodiments. Numerous additional modifications and variations are possible in light of the above teachings. It is therefore to be understood that within the scope of the appended claims, the embodiments may be practiced otherwise than as specifically described herein. For example, elements and/or features of different illustrative embodiments may be combined with each other and/or substituted for each other within the scope of this disclosure and appended claims.

What is claimed is:

1. A photoelectric conversion element, comprising:
   a plurality of pixel groups, each pixel group including a plurality of pixels,
   a plurality of amplifiers corresponding to the plurality of pixel groups, respectively, wherein each amplifier amongst the plurality of amplifiers is configured to amplify or attenuate an output range of a signal to be input from a corresponding pixel group amongst the plurality of pixel groups, to coarsely adjust the signal and output a coarsely adjusted signal;
   a plurality of analog-to-digital (A/D) convertors corresponding to the plurality of amplifiers, respectively, wherein each A/D converter amongst the plurality of A/D converters is configured to perform A/D conversion on the coarsely adjusted signal output from a corresponding amplifier amongst the plurality of amplifiers and output a digital signal; and
   a reference voltage generator configured to adjust, for each A/D converter amongst the plurality of A/D converters, an output range of the digital signal output from the A/D converter, more finely than the signal has been adjusted by the amplifier corresponding to the A/D converter.

2. The photoelectric conversion element of claim 1,
   wherein each of the pixels amongst the plurality of pixels in the pixel groups is arranged to receive light of a corresponding color amongst a plurality of colors of light being received, to respectively detect different colors of light;

wherein each amplifier amongst the plurality of amplifiers amplifies the output range of signals for the detected different colors of light sequentially output from the plurality of pixels in the pixel group corresponding to the amplifier, for coarse adjustment; and wherein the reference voltage generator finely adjusts, for each A/D converter amongst the plurality of A/D converters, the output range of the signals sequentially input to the A/D converter from each of the plurality of pixels in the pixel group corresponding to the amplifier, which corresponds to the A/D converter, and through the amplifier corresponding to the A/D converter.

3. The photoelectric conversion element of claim 1, wherein each of the plurality of A/D convertors includes a digital gain adjuster to adjust a digital gain of a signal that is output from at least one of the plurality of pixels in a corresponding one of the plurality of pixel groups and A/D converted.

4. The photoelectric conversion element of claim 3, wherein the reference voltage generator finely adjusts an output voltage range of a signal output from an A/D convertor amongst the plurality of A/D convertors in such a manner that the output voltage range of a signal output from each of the plurality of A/D convertors has a same range based on a maximum signal level among a plurality of signal levels individually output from the plurality of pixels in each of the plurality of pixel groups.

5. The photoelectric conversion element of claim 1, wherein each of the plurality of amplifiers includes a switched capacitor programmable gain amplifier (PGA) in which a gain is adjusted by switching a plurality of capacitors.

6. The photoelectric conversion element of claim 5, wherein in each of the plurality of the amplifiers, a feedback capacitance of the switched capacitor PGA is adjusted by switching a plurality of unit capacitors.

7. The photoelectric conversion element of claim 5, wherein in each of the plurality of the amplifiers, an input capacitance of the switched capacitor PGA is adjusted by switching a plurality of unit capacitors.

8. The photoelectric conversion element of claim 1, further comprising a controller configured to control the plurality of amplifiers and the reference voltage generator.

9. An image scanning device, comprising the photoelectric conversion element of claim 1.

10. An image forming apparatus, comprising: the image scanning device of claim 9; and an image forming device configured to form an image based on image data read with the image scanning device.

* * * * *